(12) United States Patent
Hadwen et al.

(10) Patent No.: US 10,978,007 B2
(45) Date of Patent: Apr. 13, 2021

(54) AM-EWOD CIRCUIT CONFIGURATION WITH SENSING COLUMN DETECTION CIRCUIT

(71) Applicant: Sharp Life Science (EU) Limited, Oxford (GB)

(72) Inventors: Benjamin James Hadwen, Oxford (GB); Oliver James Beard, Oxford (GB); Christopher James Brown, Oxford (GB)

(73) Assignee: Sharp Life Science (EU) Limited, Oxford (GB)

( * ) Notice: Subject to any disclaimer, the term of this patent is extended or adjusted under 35 U.S.C. 154(b) by 148 days.

(21) Appl. No.: 16/207,814

(22) Filed: Dec. 3, 2018

(65) Prior Publication Data

US 2020/0175932 A1 Jun. 4, 2020

(51) Int. Cl.
*G01N 27/26* (2006.01)
*G09G 3/34* (2006.01)
(Continued)

(52) U.S. Cl.
CPC .......... *G09G 3/348* (2013.01); *B01L 3/50273* (2013.01); *B01L 3/502792* (2013.01);
(Continued)

(58) Field of Classification Search
CPC ........ G09G 3/348; G09G 3/006; G01R 27/22; B01L 3/50273; B01L 3/502792; G02B 26/005
See application file for complete search history.

(56) References Cited

U.S. PATENT DOCUMENTS

| 7,163,612 B2 | 1/2007 | Sterling et al. |
| 8,653,832 B2 | 2/2014 | Hadwen et al. |

(Continued)

FOREIGN PATENT DOCUMENTS

CN 107583694 1/2018

OTHER PUBLICATIONS

Fair, R.B., "Digital microfluids: is a true lab-on-a-chip possible?" Microfluidics and Nanofluidics Jun. 2007, vol. 3, Issue 3, pp. 245-281.

(Continued)

*Primary Examiner* — Angelo Trivisonno
(74) *Attorney, Agent, or Firm* — Renner, Otto, Boisselle & Sklar, LLP

(57) ABSTRACT

An AM-EWOD device includes a plurality of array elements arranged in an array of rows and columns; each column including a column addressing line that applies control signals to a corresponding column of array elements, and each row including a row addressing line that applies control signals to a corresponding row of array elements; each array element including an element electrode for receiving an actuation voltage and a switch transistor, wherein the switch transistor is electrically connected between the column addressing line and the element electrode and is switched by the row addressing line; and a column detection circuit comprising an addressing circuit that applies an electrical perturbation during a sensing operation to the column addressing line of an array element being sensed, and a measuring circuit that measures an output signal from one of the column addressing lines, wherein the output signal varies based upon a capacitance present at the element electrode.

20 Claims, 17 Drawing Sheets

(51) Int. Cl.
*B01L 3/00* (2006.01)
*G02B 26/00* (2006.01)
*G09G 3/00* (2006.01)
*G01N 27/02* (2006.01)
*G01R 27/22* (2006.01)

(52) U.S. Cl.
CPC ........... *G01N 27/028* (2013.01); *G01R 27/22* (2013.01); *G02B 26/005* (2013.01); *G09G 3/006* (2013.01)

(56) References Cited

U.S. PATENT DOCUMENTS

| | | |
|---|---|---|
| 2012/0106238 A1 | 5/2012 | John et al. |
| 2012/0194492 A1* | 8/2012 | Hadwen .............. B01L 3/50273 |
| | | 345/207 |
| 2014/0151232 A1 | 6/2014 | Hadwen |
| 2017/0056887 A1 | 3/2017 | Hadwen et al. |
| 2017/0076676 A1 | 3/2017 | Hadwen |
| 2018/0078934 A1 | 3/2018 | Hadwen et al. |
| 2019/0070602 A1 | 3/2019 | Han et al. |

OTHER PUBLICATIONS

F Azam Shaik et al., "Thin-film-transistor array: an exploratory attempt for high throughput cell manipulation using electrowetting principle", 2017 J. Micromech. Microeng. 27 054001.

* cited by examiner

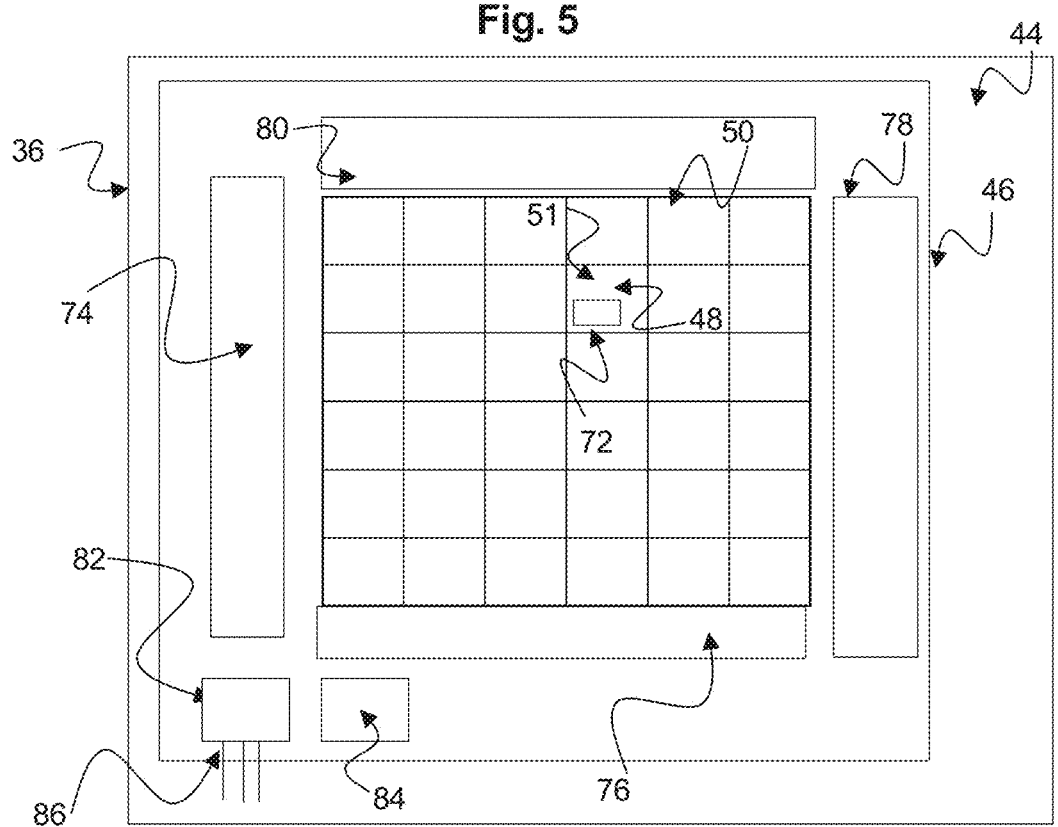

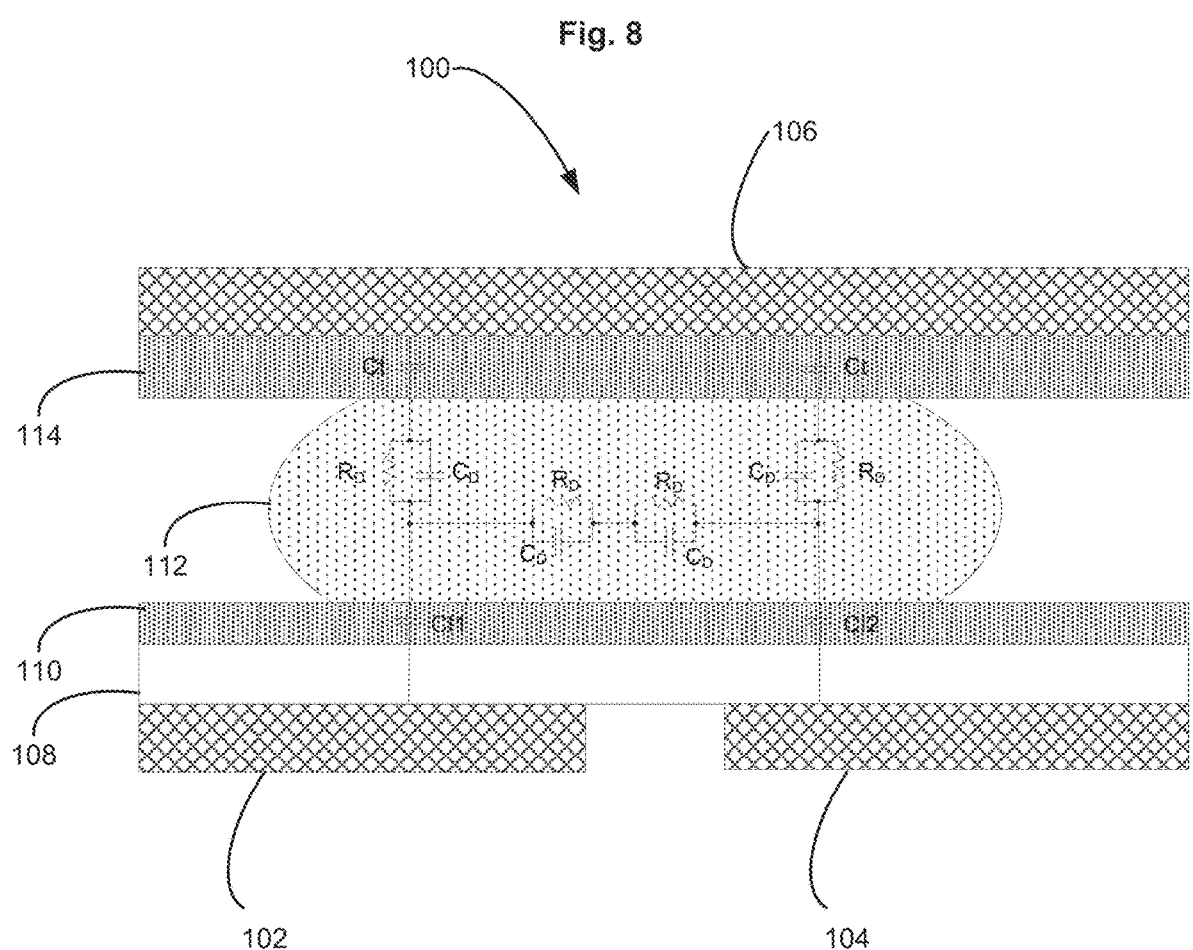

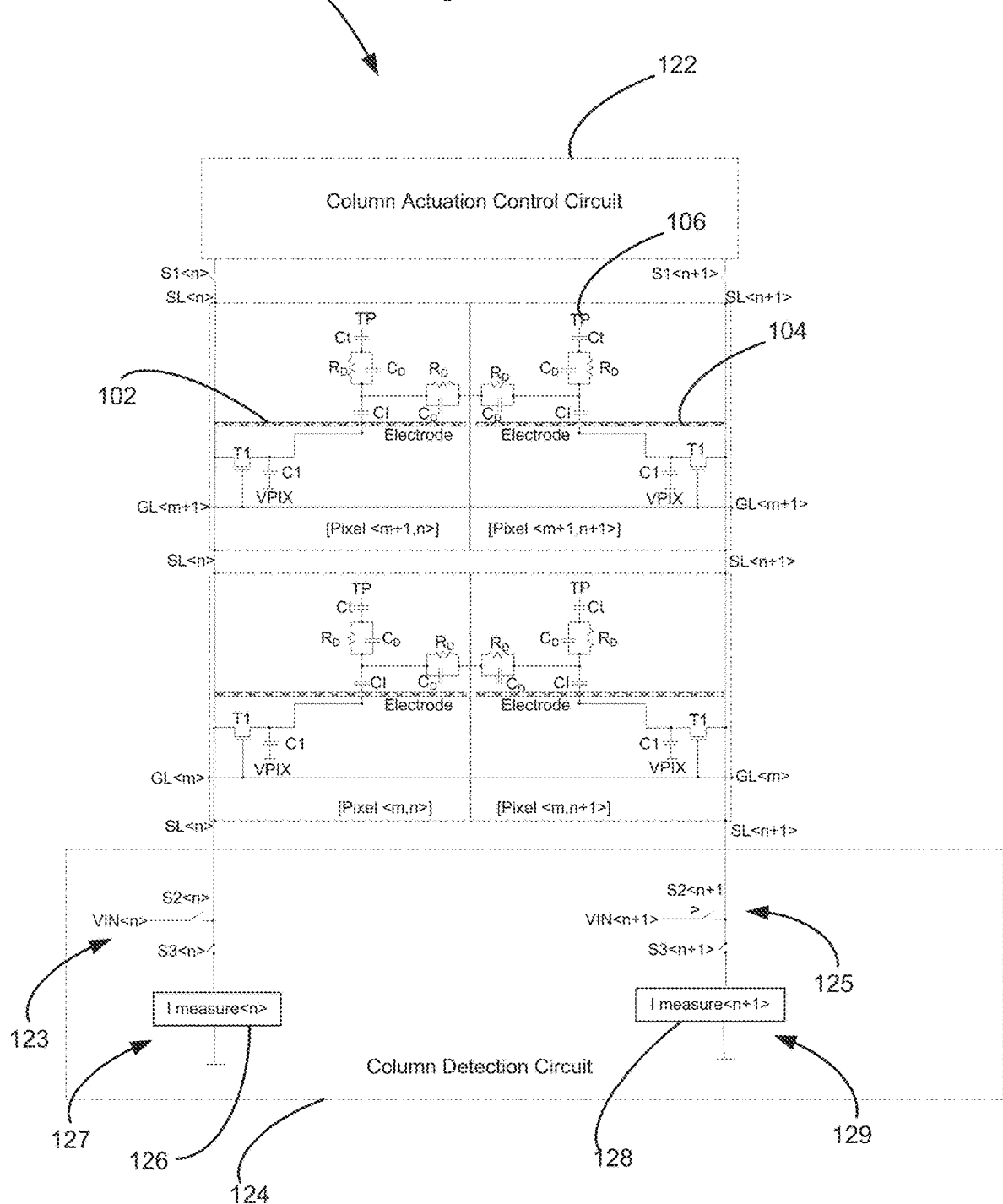

Vin(n)

Imeasure<n> - droplet present

Imeasure<n> — no droplet present

US 10,978,007 B2

AM-EWOD CIRCUIT CONFIGURATION WITH SENSING COLUMN DETECTION CIRCUIT

TECHNICAL FIELD

The present invention relates to droplet microfluidic devices, and more specifically to Active Matrix Electrowetting-On-Dielectric (AM-EWOD) devices and to circuit configurations of such devices that employ column based sensing to optimize sensing capabilities as balanced against the desire for a compact arrangement.

BACKGROUND ART

Electrowetting on dielectric (EWOD) is a well-known technique for manipulating droplets of fluid by application of an electric field. Active Matrix EWOD (AM-EWOD) refers to implementation of EWOD in an active matrix array incorporating transistors, for example by using thin film transistors (TFTs). It is thus a candidate technology for digital microfluidics for lab-on-a-chip technology. An introduction to the basic principles of the technology can be found in "Digital microfluidics: is a true lab-on-a-chip possible?", R. B. Fair, Microfluid Nanofluid (2007) 3:245-281).

FIG. 1 is a drawing depicting an exemplary EWOD based microfluidic system. In the example of FIG. 1, the microfluidic system includes a reader 32 and a cartridge 34. The cartridge 34 may contain a microfluidic device, such as an AM-EWOD device 36, as well as (not shown) fluid input ports into the device and an electrical connection as are conventional. The fluid input ports may perform the functions of inputting fluid into the AM-EWOD device 36 and generating droplets within the device, for example by dispensing from input reservoirs as controlled by electrowetting. As further detailed below, the microfluidic device includes an electrode array configured to receive the inputted fluid droplets.

The microfluidic system further may include a control system configured to control actuation voltages applied to the electrode array of the microfluidic device to perform manipulation operations to the fluid droplets. For example, the reader 32 may contain such a control system configured as control electronics 38 and a storage device 40 that may store any application software and any data associated with the system. The control electronics 38 may include suitable circuitry and/or processing devices that are configured to carry out various control operations relating to control of the AM-EWOD device 36, such as a CPU, microcontroller or microprocessor.

In the example of FIG. 1, an external sensor module 35 is provided for sensor droplet properties. For example, optical sensors as are known in the art may be employed as external sensors for sensing droplet properties. Suitable optical sensors include camera devices, light sensors, charged coupled devices (CCD) and similar image sensors, and the like. A sensor additionally or alternatively may be configured as internal sensor circuitry incorporated as part of the drive circuitry in each array element. Such sensor circuitry may sense droplet properties by the detection of an electrical property at the array element, such as impedance or capacitance.

FIG. 2 is a drawing depicting additional details of the exemplary AM-EWOD device 36 in schematic perspective. The AM-EWOD device 36 has a lower substrate assembly 44 with thin film electronics 46 disposed upon the lower substrate assembly 44. The thin film electronics 46 are arranged to drive array element electrodes 48. A plurality of array element electrodes 48 are arranged in an electrode or element two-dimensional array 50, having N rows by M columns of array elements where N and M may be any integer. A liquid droplet 52 which may include any polar liquid and which typically may be aqueous, is enclosed between the lower substrate 44 and a top substrate 54 separated by a spacer 56, although it will be appreciated that multiple liquid droplets 52 can be present.

FIG. 3 is a drawing depicting a cross section through some of the array elements of the exemplary AM-EWOD 36 device of FIG. 2. In the portion of the AM-EWOD device depicted in FIG. 3, the device includes a pair of the array element electrodes 48A and 48B that are shown in cross section that may be utilized in the electrode or element array 50 of the AM-EWOD device 36 of FIG. 3. The AM-EWOD device 36 further incorporates the thin-film electronics 46 disposed on the lower substrate 44, which is separated from the upper substrate 54 by the spacer 56. The uppermost layer of the lower substrate 44 (which may be considered a part of the thin film electronics layer 46) is patterned so that a plurality of the array element electrodes 48 (e.g. specific examples of array element electrodes are 48A and 48B in FIG. 3) are realized. The term element electrode 48 may be taken in what follows to refer both to the physical electrode structure 48 associated with a particular array element, and also to the node of an electrical circuit directly connected to this physical structure. A reference electrode 58 is shown in FIG. 3 disposed upon the top substrate 54, but the reference electrode alternatively may be disposed upon the lower substrate 44 to realize an in-plane reference electrode geometry. The term reference electrode 58 may also be taken in what follows to refer to both or either of the physical electrode structure and also to the node of an electrical circuit directly connected to this physical structure.

In the AM-EWOD device 36, a non-polar fluid 60 (e.g. oil) may be used to occupy the volume not occupied by the liquid droplet 52. An insulator layer 62 may be disposed upon the lower substrate 44 that separates the conductive element electrodes 48A and 48B from a first hydrophobic coating 64 upon which the liquid droplet 52 sits with a contact angle 66 represented by θ. The hydrophobic coating is formed from a hydrophobic material (commonly, but not necessarily, a fluoropolymer). On the top substrate 54 is a second hydrophobic coating 68 with which the liquid droplet 52 may come into contact. The reference electrode 58 is interposed between the top substrate 54 and the second hydrophobic coating 68.

The contact angle θ for the liquid droplet is defined as shown in FIG. 3, and is determined by the balancing of the surface tension components between the solid-liquid ($y_{SL}$), liquid-gas ($y_{LG}$) and non-ionic fluid ($y_{SG}$) interfaces, and in the case where no voltages are applied satisfies Young's law, the equation being given by:

$$\cos\theta = \frac{y_{SG} - y_{SL}}{y_{LG}} \quad \text{(equation 1)}$$

In operation, voltages termed the electrowetting (EW) drive voltages, (e.g. $V_T$, $V_0$ and $V_{00}$ in FIG. 3) may be externally applied to different electrodes (e.g. reference electrode 58, element electrodes 48A and 48A, respectively). The resulting electrical forces that are set up effectively control the hydrophobicity of the hydrophobic coating

64. By arranging for different EW drive voltages (e.g. $V_O$ and $V_{OO}$) to be applied to different element electrodes (e.g. 48A and 48B), the liquid droplet 52 may be moved in the lateral plane between the two substrates.

FIG. 4A shows a circuit representation of the electrical load 70A between the element electrode 48 and the reference electrode 58 in the case when a liquid droplet 52 is present. The liquid droplet 52 can usually be modeled as a resistor and capacitor in parallel. Typically, the resistance of the droplet will be relatively low (e.g. if the droplet contains ions) and the capacitance of the droplet will be relatively high (e.g. because the relative permittivity of polar liquids is relatively high, e.g. ~80 if the liquid droplet is aqueous). In many situations the droplet resistance is relatively small, such that at the frequencies of interest for electrowetting, the liquid droplet 52 may function effectively as an electrical short circuit. The hydrophobic coatings 64 and 68 have electrical characteristics that may be modelled as capacitors, and the insulator 62 may also be modelled as a capacitor. The overall impedance between the element electrode 48 and the reference electrode 58 may be approximated by a capacitor whose value is typically dominated by the contribution of the insulator 62 and hydrophobic coatings 64 and 68 contributions, and which for typical layer thicknesses and materials may be on the order of a pico-Farad in value.

FIG. 4B shows a circuit representation of the electrical load 70B between the element electrode 48 and the reference electrode 58 in the case when no liquid droplet is present. In this case the liquid droplet components are replaced by a capacitor representing the capacitance of the non-polar fluid 60 which occupies the space between the top and lower substrates. In this case the overall impedance between the element electrode 48 and the reference electrode 58 may be approximated by a capacitor whose value is dominated by the capacitance of the non-polar fluid and which is typically small, on the order of femto-Farads.

For the purposes of driving and sensing the array elements, the electrical load 70A/70B overall functions in effect as a capacitor, whose value depends on whether a liquid droplet 52 is present or not at a given element electrode 48. In the case where a droplet is present, the capacitance is relatively high (typically of order pico-Farads), whereas if there is no liquid droplet present the capacitance is low (typically of order femto-Farads). If a droplet partially covers a given electrode 48 then the capacitance may approximately represent the extent of coverage of the element electrode 48 by the liquid droplet 52.

U.S. Pat. No. 7,163,612 (Sterling et al., issued Jan. 16, 2007) describes how TFT based thin film electronics may be used to control the addressing of voltage pulses to an EWOD array by using circuit arrangements very similar to those employed in active matrix display technologies. The approach of U.S. Pat. No. 7,163,612 may be termed "Active Matrix Electrowetting on Dielectric" (AM-EWOD). There are several advantages in using TFT based thin film electronics to control an EWOD array, namely:

Electronic driver circuits can be integrated onto the lower substrate.

TFT-based thin film electronics are well suited to the AM-EWOD application. They are cheap to produce so that relatively large substrate areas can be produced at relatively low cost.

TFTs fabricated in standard processes can be designed to operate at much higher voltages than transistors fabricated in standard CMOS processes. This is significant since many EWOD technologies require electrowetting voltages in excess of 20V to be applied.

FIG. 5 is a drawing depicting an exemplary arrangement of thin film electronics 46 in the exemplary AM-EWOD device 36 of FIG. 2. The thin film electronics 46 is located upon the lower substrate 44. Each array element 51 of the array of elements 50 contains an array element circuit 72 for controlling the electrode potential of a corresponding element electrode 48. Integrated row driver 74 and column driver 76 circuits are also implemented in thin film electronics 46 to supply control signals to the array element circuit 72. The array element circuit 72 may also contain a sensor capability for detecting the presence or absence of a liquid droplet in the location of the array element. Integrated sensor row addressing 78 and column detection circuits 80 may further be implemented in thin film electronics for the addressing and readout of the sensor circuitry in each array element.

A serial interface 82 may also be provided to process a serial input data stream and facilitate the programming of the required voltages to the element electrodes 48 in the array 50. A voltage supply interface 84 provides the corresponding supply voltages, top substrate drive voltages, and other requisite voltage inputs as further described herein. A number of connecting wires 86 between the lower substrate 44 and external control electronics, power supplies and any other components can be made relatively few, even for large array sizes. Optionally, the serial data input may be partially parallelized. For example, if two data input lines are used the first may supply data for columns 1 to X/2, and the second for columns (1+X/2) to M with minor modifications to the column driver circuits 76. In this way the rate at which data can be programmed to the array is increased, which is a standard technique used in liquid crystal display driving circuitry.

Various methods of controlling an AM-EWOD device to sense droplets and perform desired droplet manipulations have been described. For example, US 2017/0056887 (Hadwen et al., published Mar. 2, 2017) describes the use of capacitance detection to sense dynamic properties of reagents as a way for determining the output of an assay. Such disclosure incorporates an integrated impedance sensor circuit that is incorporated specifically into the array element circuitry of each array element.

Accurate droplet sensing has been a significant subject of development in the field of AM-EWOD devices. For example, F. Azam Shaik et al, 2017, J. Micromech Microeng. 27 054001 (Shaik), is a recent paper by Tokyo university describing an AM-EWOD device with a one-transistor/one-capacitor (1T/1C) array element circuit. The article describes sensing droplets by measuring the mutual capacitance between column lines by pulsing a source line with a 1 Vp—p AC voltage, while the current output from the adjacent source line is measured. The article, therefore, describes a sensing scheme that employs sensing the potential between electrodes by sensing the capacitance between different column lines, referred to in the art as mutual capacitance sensing. Although providing an experimental basis for such mutual capacitance sensing, the actual system is impractical for real-word device applications. The measurement is done entirely by external sensing equipment, and there is no integrated sensing or other integrated column circuitry of any kind. The experimental usage of such external components is impractical for large arrays since an external connection is needed to each column of the array. Shaik also does not describe a self-capacitance implementation, which in the art refers to detecting impedance by perturbing a voltage (or current) and measuring the corresponding current (or voltage) on the same column line, which is useful in certain circumstances.

As referenced above, therefore, attempts have been made to integrate impedance sensing circuitry into the array element structure, and in particular as part of the array element circuitry. FIG. 6 is a drawing depicting an array element including exemplary array element circuitry for an AM-EWOD device that embodies a previous design of Applicant. This basic circuit has three thin film transistors (TFTs T1, T2, and T3) and two capacitors (C1 and C2), i.e., a 3T/2C configuration, and is associated with seven addressing lines. The pixel circuits, here and throughout, are drawn with the following conventions. The boundaries of a pixel are denoted by a dotted line. Row and column addressing lines are shown passing through the pixel in the horizontal and vertical directions respectively. Power supply connections, which could in principle be supplied either in row or column lines, are shown by short horizontal lines (e.g. VCCA in FIG. 6). Connecting wires are shown with a solder dot, and without the dot, crossing lines do not connect.

The node marked electrode is connected to the array element electrode. The components CI, $R_{drop}$ and $C_{drop}$ represent the approximate load presented between the device electrode and the top reference electrode TP in an operational situation by the device structure layers, the oil, and the presence of a liquid droplet if any. Since these components are not explicitly part of the thin film electronics circuit, they are not included in the stated design component counts. CI represents the capacitance of the hydrophobic coatings in contact with the upper and lower surface of the droplet and any other insulator layers incorporated into the device. The values of $R_{drop}$ and $C_{drop}$ will vary based on the presence or absence of a droplet, as described above with respect to FIGS. 4A and 4B. Example AM-EWOD devices having this basic circuit design are described in Applicant's commonly assigned U.S. Pat. No. 8,653,832 (Hadwen et al., issued Feb. 18, 2014) and US 2018/0078934 (Hadwen et al., published Mar. 22, 2018).

The circuit of FIG. 6 generally is operated generally as follows. To program an array element by writing voltage data to said array element, the voltage to be programmed is loaded onto addressing line SL, and a pulse is applied to the gate line GL appropriate for the row being programmed. This turns on a switch transistor T1, and the circuit node connected to the electrode is charged to the programmed voltage. When GL is taken low, this voltage is preserved, stored on a storage capacitor C1. Typically, C1 is larger than the second or sensor capacitor C2 by at least about an order of magnitude. To perform sensing, in a reset step a reset transistor T2 is turned on by an RST signal, so the gate of a sensor readout transistor T3 charges to VCCA. VCCA is a reset potential chosen below the threshold voltage of T3 such that T3 remains off and any previous voltage is cleared. In a sensing step, an addressing line RWS is pulsed. For the duration of the RWS pulse, the electrode potential is perturbed to a higher voltage. The change in voltage achieved is principally a function of the ratio of capacitor C1 to the total capacitance at the array element electrode, which includes the load associated with whether the droplet is present or absent. The sensor capacitor performs the function of AC coupling a perturbation in the potential of the element electrode through to the gate of T3. The perturbed potential at the gate of T3 is thus a function only of the change (perturbation) in voltage at the element electrode and not the DC level of the electrode voltage. The perturbation is coupled through the sensor capacitor C2 to the gate of T3, and transistor T3 is accordingly turned on to an extent determined by the amplitude of the pulse as coupled. The resultant current passes through T3 and sunk down a sensor output column line COL, which may then be sensed by column detection circuitry at the bottom of the column of the array (not shown).

FIG. 7 is a drawing depicting a plurality of array elements of FIG. 6 configured as a 2×2 element array. It will be appreciated that any suitable number of array elements may be incorporated into a desired size of a two-dimensional array of rows and columns. When configured as an array in this manner, each array element incorporates its own 3T/2C array element circuitry, i.e., the various circuit elements are repeated in the circuitry of every array element. This basic impedance sensing circuitry can be combined with various configurations of actuation circuitry to apply different types of actuation voltage to a device element array.

Although such integrated impedance sensing circuitry provides effective sensing, the size of the array element circuitry must be enlarged. In the Shaik device employed for academic study of capacitance-based measurements, the array element circuitry has a 1T/1C configuration, as the entire sensing and measuring apparatus is provided externally from the EWOD device array. In the example of integrated sensing circuitry of FIGS. 6 and 7, each array element has a larger 3T/2C configuration, which further may be combined with additional elements of a desired actuation circuitry.

The integration of the impedance sensor circuitry into the array element circuitry represents a need to balance two significant factors. It is highly desirable to include a sensing function integrated within the array element circuitry for sensing the presence, absence, and size of liquid droplets on the array as well as other device or droplet properties. For example, integrated sensing facilitates operation of the device in a "closed loop" mode whereby sensor feedback is used to optimize the actuation patterns applied to the array elements for droplet manipulations. On the other hand, it also is desirable to make the array elements as small as possible, in particular for single cell applications, and to provide a higher resolution for droplet manipulations. Smaller array elements require the layout area of the array element circuitry to be reduced, and hence simplified circuit architectures with fewer transistors and/or capacitors are desirable. As described above, incorporation of a sensing capability into the array element circuitry typically uses additional circuit components (TFTs, capacitors, addressing lines) integrated into the array element. While this affords good performance sensing with a high signal-to-noise ratio, the additional circuit components add real estate and limit the extent to which the array elements can be made smaller.

SUMMARY OF INVENTION

There is a need in the art to provide a thin film electronics configuration for an AM-EWOD device that provides an enhanced balance between the advantages of an integrated sensing capability and the desire for a small array element size. This disclosure describes an integrated impedance sensing arrangement within the thin film electronics structure, whereby sensing can be implemented without providing additional circuit components specifically within the array element structure itself. Such a configuration achieves sufficient integration to keep a small number of connections to the thin film electronics substrate without enlargement of individual array element circuitry, and without using external sensing devices that are not suitable for large arrays of hundreds or even thousands of columns.

Exemplary embodiments include a thin film electronics configuration and a method for sensing droplets at the array elements of an AM-EWOD device, whereby the sensing circuitry is integrated onto the thin film electronics substrate, but is arranged in a column detection circuit rather than being integrated specifically into the array element circuitry of each individual array element. The array element circuitry, therefore, may have a more conventional topology that does not include any specialized components for sensing operations. Rather, the sensing function is implemented using the column addressing and row addressing lines that are also used to control electrowetting actuation.

In exemplary embodiments, the following circuitry is integrated onto the thin film electronics substrate. The thin film electronics includes an array of array elements, which also may be referred to as pixels, each pixel including array element circuitry and an element electrode, and at least one column addressing line connected to array elements in a common column of the element array. The thin film electronics further includes a column detection circuit including the column addressing lines connected to the individual array elements.

The column detection circuit is configured for measuring impedance, as defined by the complex relationship:

$$V = ZI,$$

whereby V is the complex representation of a time varying voltage, I is the complex representation of the time varying current, and Z is the complex impedance comprised of resistive and capacitive components (inductive components can generally be ignored). Consequently, it is possible to determine Z either by varying V and measuring I, or by varying I and measuring V.

A perturbing (time varying) electrical input (voltage or current) is provided on at least one column addressing line, which is coupled to provide an electrical perturbation output signal on at least one column addressing line. The output signal will depend on impedance (=capacitance) variations through the coupling pathway, which in turn are associated with droplet and/or device properties at the array element or elements being sensed. In a mutual capacitance mode, the input electrical perturbation (voltage or current) is applied, and the output (voltage or current) perturbation is detected, on column addressing lines of different array elements in different columns. In a self-capacitance mode, the input voltage perturbation is applied, and the output current perturbation is detected, on a column addressing line of a single or same array element. Alternatively, a self-capacitance mode may operate by perturbing the current and detecting the change in voltage.

In exemplary embodiments, a method of sensing is based on sensing the mutual capacitance between two element electrodes with a coupling signal pathway created between them to the column detection circuitry. Transistor elements within circuitry of at least two array elements in different columns of the device array are configured such that a signal path is created between a column addressing line and the element electrode in each of the first and second array elements. A time dependent voltage signal is applied to a first column line and is coupled through a first array element electrode of the first array element. Such voltage is then perturbed, and the perturbation of the voltage at the first array element electrode is coupled through to a second array element electrode of a second array element (which is a neighboring array element but not necessarily adjacent). The voltage perturbation is coupled from the first array element to the second array element to an extent determined by the droplet coverage atop the element electrode layer and between the first and second array element electrodes. The voltage perturbation at the second array element electrode is then coupled through to the column addressing line of the second array element, and said voltage perturbation is outputted from the second column addressing line, either as a voltage or a current, and measured. As referenced above, in a self-capacitance mode, the input voltage perturbation is applied and the output current perturbation is measured on a common column addressing line of a single or same array element.

An advantage of the embodiments over conventional configurations is that sensing the capacitance present at each array element in the device array is performed without requiring additional circuit elements to be integrated specifically into the array element circuitry. There remains substantial sensing integration, however, as the sensing function is integrated into the column detection circuit within the thin film electronics layer. In this manner, substantial benefits of integrated sensing are achieved, such as for example closed loop functioning and high signal-to-noise ratio, without having to increase the size of the array element circuitry in each individual array element as desired for high resolution applications.

An aspect of the invention, therefore, is an active matrix electro-wetting on dielectric (AM-EWOD) device including a column detection circuit that performs a sensing function based on measured capacitance variations between addressing lines that provide control signals to the array elements. In exemplary embodiments, the AM-EWOD device includes a plurality of array elements arranged in an array of rows and columns; each column including a column addressing line that applies control signals to a corresponding column of array elements, and each row including a row addressing line that applies control signals to a corresponding row of array elements; each array element including an element electrode for receiving an actuation voltage and a switch transistor, wherein the switch transistor is electrically connected between the column addressing line and the element electrode and is switched by the row addressing line; and a column detection circuit comprising an addressing circuit that applies an electrical perturbation during a sensing operation to the column addressing line of an array element being sensed, and a measuring circuit that measures an output signal from one of the column addressing lines, wherein the output signal varies based upon a capacitance present at the element electrode. The measuring circuit may be configured to operate in a mutual capacitance mode by measuring the output signal from a column addressing line that corresponds to a different column addressing line from the array element being sensed, or may be configured to operate in a self-capacitance mode by measuring the output signal from a column addressing line that corresponds to the same column addressing line as the array element being sensed.

Another aspect of the invention is a method of operating the AM-EWOD device to perform a sensing function, which may sense droplet and/or device properties based on measured capacitance variations between addressing lines that provide control signals to the array elements. In exemplary embodiments, the method of operating includes: arranging a plurality of array elements in an array of rows and columns, each column including a column addressing line that applies control signals to a corresponding column of array elements, and each row including a row addressing line that applies control signals to a corresponding row of array elements; providing a column detection circuit comprising an addressing circuit and a measuring circuit; and performing a sensing operation by the steps of: applying a voltage perturbation from the addressing circuit to the column addressing line of an array element being sensed; and measuring an output signal with the measuring circuit from one of the column addressing lines, wherein the output signal varies based upon a capacitance present at an array element electrode of the array element being sensed. The measuring circuit may operate in a mutual capacitance mode by measuring the output signal from a column addressing line that corresponds to a different column addressing line from the array element being sensed, or may operate in a self-capacitance mode by measuring the output signal from a column addressing line that corresponds to the same column addressing line as the array element being sensed.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto. Features that are described and/or illustrated with respect to one embodiment may be used in the same way or in a similar way in one or more other embodiments and/or in combination with or instead of the features of the other embodiments.

BRIEF DESCRIPTION OF DRAWINGS

FIG. 5 is a drawing depicting an exemplary arrangement of thin film electronics in the exemplary AM-EWOD device of FIG. 2.

FIG. 8 is a drawing depicting a circuit representation of components of a portion of an AM-EWOD device.

FIG. 9A and FIG. 9B are drawings depicting a plurality of array elements including exemplary array element circuitry for an AM-EWOD device, which employs a mutual capacitance sensing mode.

FIG. 16 is a timing diagram that illustrates the operation of the embodiment of FIG. 15.

DESCRIPTION OF EMBODIMENTS

Figure 1:
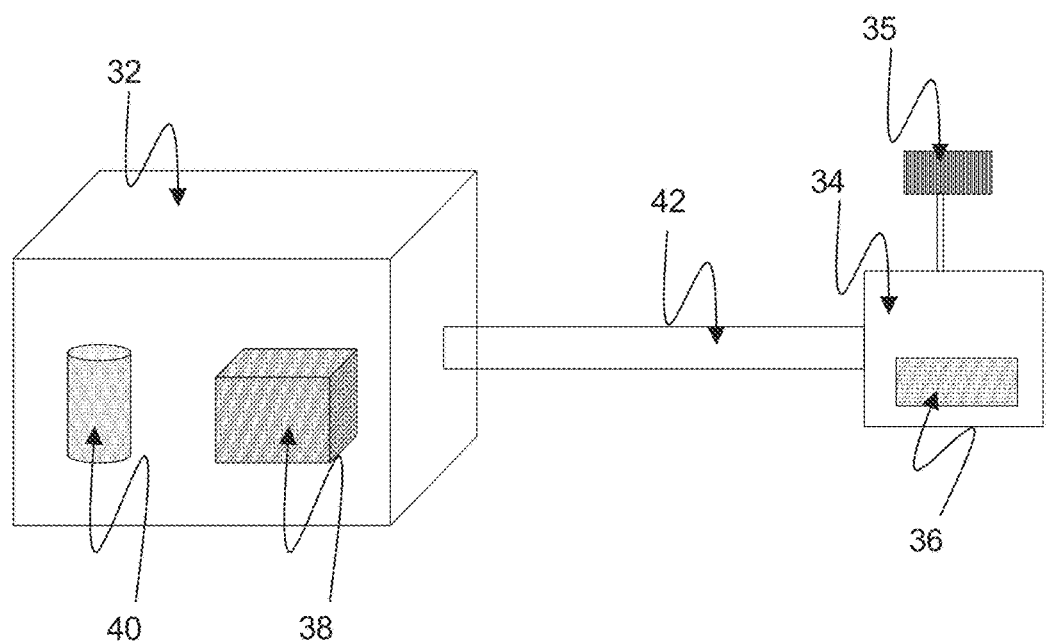
FIG. 1 is a drawing depicting an exemplary EWOD based microfluidic system.
Figure 2:
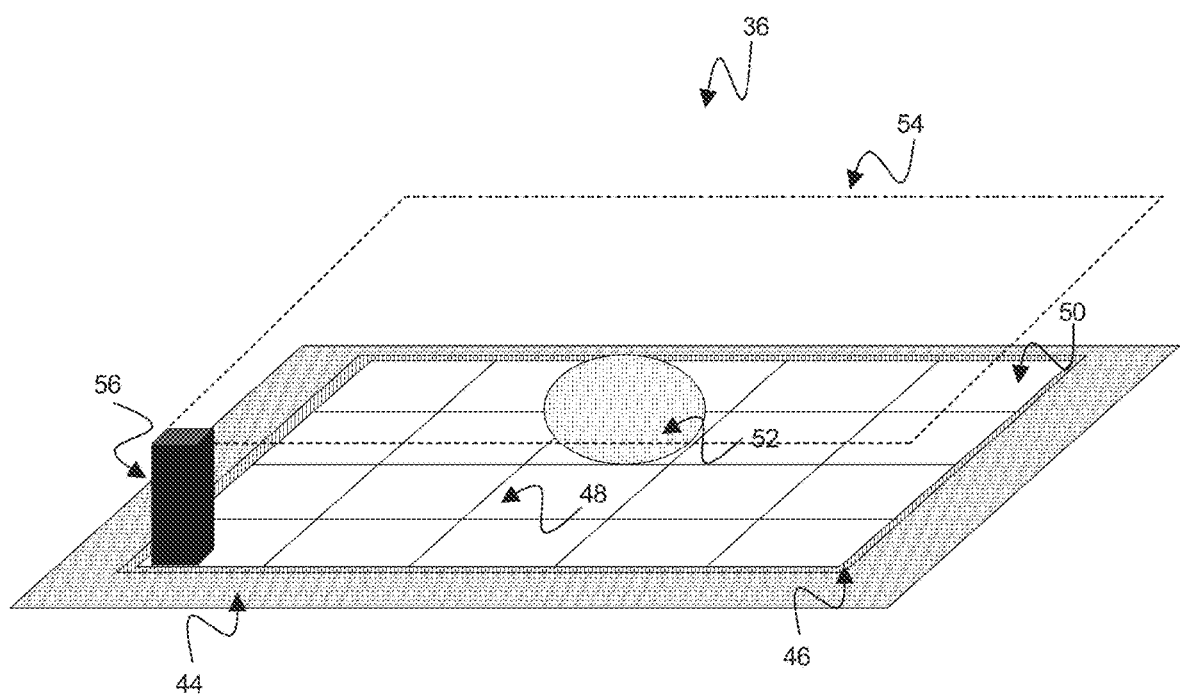
FIG. 2 is a drawing depicting an exemplary AM-EWOD device in schematic perspective.
Figure 3:
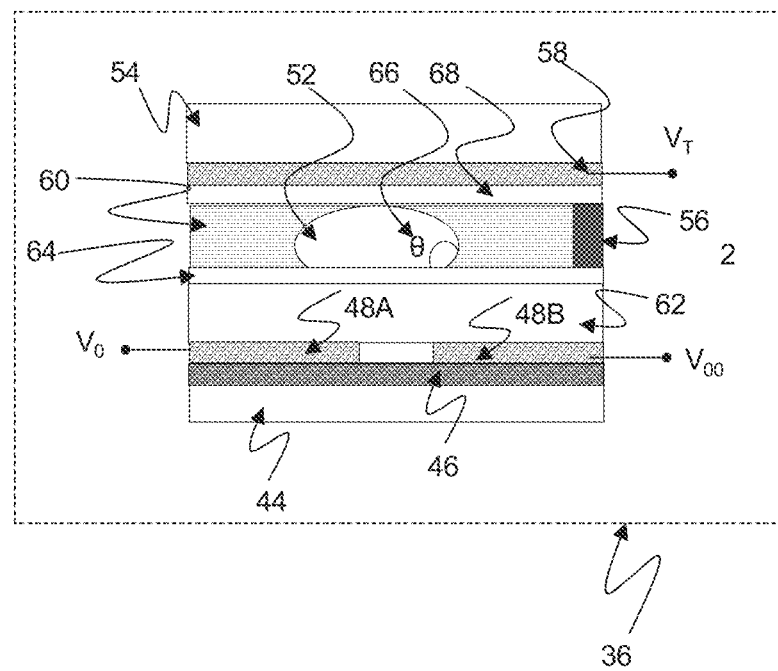
FIG. 3 is a drawing depicting a cross section through some of the array elements of the exemplary AM-EWOD device of FIG. 2.
Figure 4A:
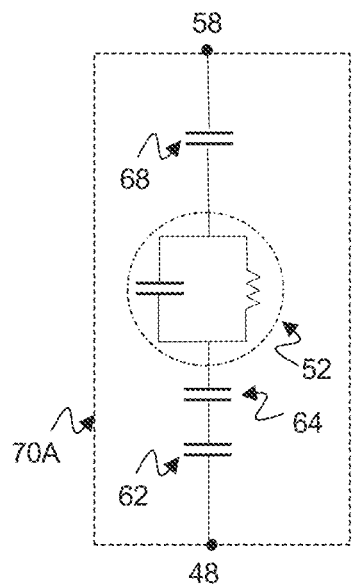
FIG. 4A is a drawing depicting a circuit representation of the electrical load presented at the element electrode when a liquid droplet is present.
Figure 4B:
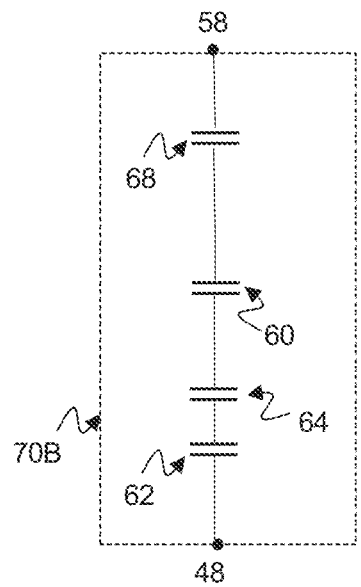
FIG. 4B is a drawing depicting a circuit representation of the electrical load presented at the element electrode when no liquid droplet is present.

Embodiments of the present invention will now be described with reference to the drawings, wherein like reference numerals are used to refer to like elements throughout. It will be understood that the figures are not necessarily to scale.

FIG. 8 is a drawing depicting a circuit representation of components of a portion of an AM-EWOD device 100, which may have a structural configuration comparably as depicted in FIGS. 1-5. In this illustration, the device portion 100 spans two array elements including a first array element electrode 102 and a second array element electrode 104. For applying actuation voltages, the array element electrodes 102 and 104 are spaced apart from a reference (top) electrode 106, whereby actuation voltages are applied based on a potential difference between the array element electrodes and the reference electrode. CI represents the series capacitance combination of an ion barrier insulator 108 and a first hydrophobic coating 110 applied on the array element electrode layer. The capacitance CI between a liquid droplet 112 and a given element electrode is proportional to the area of coverage of the liquid droplet over the corresponding element electrode, which effectively is the area of the resultant capacitor. The capacitance CI, therefore, can vary as to each element electrode, and thus is denoted CI1 as to the first element electrode 102 and CI2 for second element electrode 104.

$C_D$ and $R_D$ are representative of the electrical constitution (resistances and capacitances) of the liquid droplet 112 as positioned relative to the array element electrodes. In most applications, the droplet resistance is small and the liquid droplet functions essentially as a short circuit. The total capacitance between the two electrodes is thus the series combination of CI1 and CI2, plus a small parasitic (fringing) capacitance. Ct represents the capacitance between the droplet 112 at the reference electrode 106 from a second hydrophobic coating 114, which is spaced apart from the first hydrophobic coating 110 to form the cell gap in which the liquid droplet 112 is present.

In exemplary embodiments, the following circuitry is integrated onto the thin film electronics substrate that contains the array element electrodes. The thin film electronics includes an array of array elements, which also may be referred to as pixels, each pixel including array element circuitry and an element electrode, and at least one column addressing line connected to array elements in a common column of the element array. The thin film electronics further includes a column detection circuit including the column addressing lines connected to the individual array elements.

The column detection circuit is configured for measuring impedance, as defined by the complex relationship $$V = ZI$$

whereby V is the complex representation of a time varying voltage, I is the complex representation of the time varying current, and Z is the complex impedance comprised of resistive and capacitive components (inductive components can generally be ignored). Consequently, the capacitive portion of the impedance, C, can be related to the standard expression $$C = \frac{I}{\left(\frac{dV}{dt}\right)}$$

Typically, and most conveniently, the capacitance C may be measured by applying a time varying potential and measuring the resultant current, and subsequent embodiments describe configurations associated with this mode of operation. It will be appreciated that equally it is possible to a apply a current and measure the resultant voltage.

A perturbing voltage input is provided on at least one column addressing line, which is coupled to provide a voltage perturbation output signal on at least one column addressing line. The output signal will depend on capacitance variations through the coupling pathway, which in turn are associated with droplet and/or device properties at the array element or elements being sensed. In a mutual capacitance mode, the input voltage perturbation is applied, and the output voltage or current) perturbation is detected, on column addressing lines of different array elements in different columns. In a self-capacitance mode, the input voltage or current perturbation is applied, and the output voltage or current perturbation is detected, on a column addressing line of a single or same array element.

In exemplary embodiments, a method of sensing is based on sensing the mutual capacitance between two element electrodes with a coupling signal pathway created between them to the column detection circuitry. Transistor elements within circuitry of at least two array elements in different columns of the device array are configured such that a signal path is created between a column addressing line and the element electrode in each of the first and second array elements. A time dependent voltage signal is applied to a first column line and is coupled through a first array element electrode of the first array element. Such voltage is then perturbed, and the perturbation of the voltage at the first array element electrode is coupled through to a second array element electrode of a second array element (which is a neighboring array element but not necessarily adjacent). The voltage perturbation is coupled from the first array element to the second array element to an extent determined by the droplet coverage atop the element electrode layer and between the first and second array element electrodes. The voltage perturbation at the second array element electrode is then coupled through to the column addressing line of the second array element, and said voltage perturbation is outputted from the second column addressing line and measured.

An aspect of the invention, therefore, is an active matrix electro-wetting on dielectric (AM-EWOD) device including a column detection circuit that performs a sensing function based on capacitance variations between addressing lines that provide control signals to the array elements. In exemplary embodiments, the AM-EWOD device includes a plurality of array elements arranged in an array of rows and columns; each column including a column addressing line that applies control signals to a corresponding column of array elements, and each row including a row addressing line that applies control signals to a corresponding row of array elements; each array element including an element electrode for receiving an actuation voltage and a switch transistor, wherein the switch transistor is electrically connected between the column addressing line and the element electrode and is switched by the row addressing line; and a column detection circuit comprising an addressing circuit that applies an electrical perturbation during a sensing operation to the column addressing line of an array element being sensed, and a measuring circuit that measures an output signal from one of the column addressing lines, wherein the output signal varies based upon a capacitance present at the element electrode. The measuring circuit may be configured to operate in a mutual capacitance mode by measuring the output signal from a column addressing line that corresponds to a different column addressing line from the array element being sensed, or may be configured to operate in a self-capacitance mode by measuring the output signal from a column addressing line that corresponds to the same column addressing line as the array element being sensed.

As an example of such embodiments, FIG. 9A is a drawing depicting a plurality of array elements 120 including exemplary array element circuitry for an AM-EWOD device in accordance with embodiments of the present invention. FIG. 10 is a timing diagram that illustrates a sensing operation of the embodiment of FIG. 9. FIG. 9 depicts a 2×2 array portion 120 of rows ($m_i$) and columns ($n_i$), and thus the example array portion includes the following set of array elements: pixel (m, n); pixel (m+1, n); pixel (m, n+1), and pixel (m+1, n+1). It will be appreciated that in actual implementation, any suitable number of array elements arranged in rows and columns may be employed in the various embodiments. FIG. 9A further includes the circuit representations of the liquid droplet and device layers similarly as are illustrated in FIG. 8. Such circuit representations are depicted again as positioned relative to the first array element electrode 102 and the second array element electrode 104, and the reference (top) electrode 106 denoted as TP in FIG. 9A, for each of the individual array elements or pixels.

Each column includes a column addressing line SL that applies control signals to a corresponding column of array elements, and each row includes a row addressing line GL that applies control signals to a corresponding row of array elements. In addition, each array element includes an element electrode (e.g., 102/104) for receiving an actuation voltage and a switch transistor T1, wherein the switch transistor T1 is connected between the column addressing line SL and the element electrode and is switched by the row addressing line GL as further detailed below.

Figure 6:
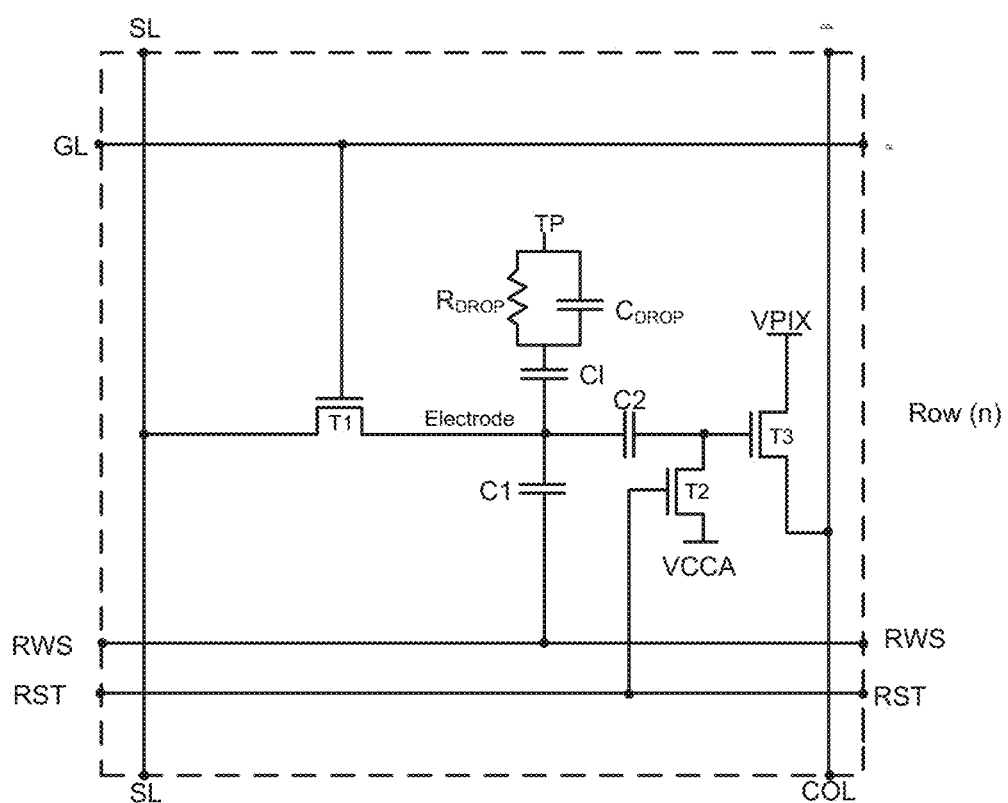
FIG. 6 is a drawing depicting an array element including exemplary array element circuitry for an AM-EWOD device that embodies a previous design of Applicant.
Figure 7:
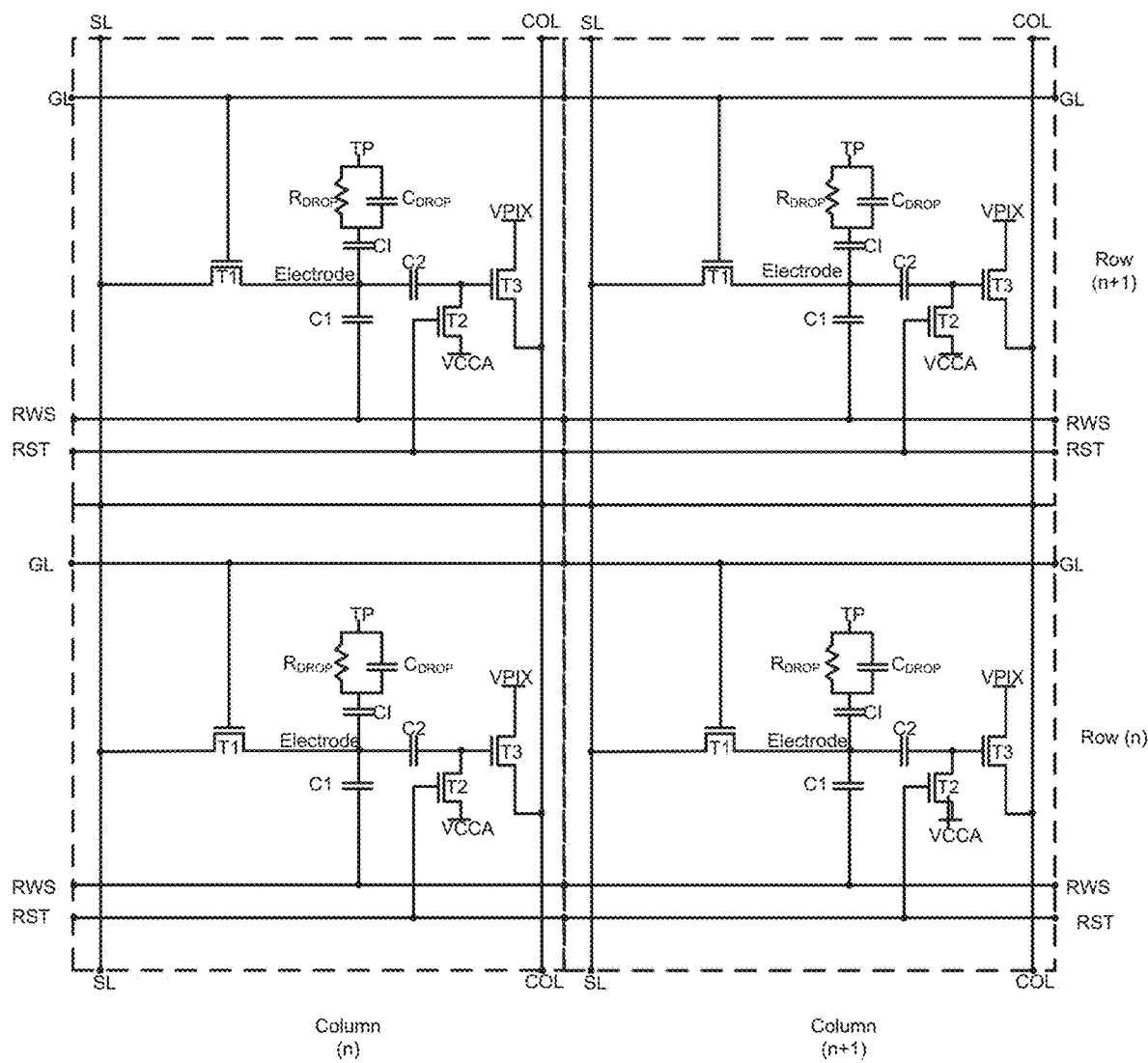
FIG. 7 is a drawing depicting a plurality of array elements of FIG. 6 configured as a 2×2 element array.

Programming and actuation are performed similarly as in Applicant's previous circuit design as illustrated in FIGS. 6 and 7. Programming and actuation is controlled by a column actuation control circuit 122 that is integrated into the thin film electronics. To program an array element by writing voltage data to said array element, the voltage to be programmed is loaded onto addressing line SL associated with the array element being actuated, and a pulse is applied to the gate line GL appropriate for the row being programmed. For the 2×2 array portion, the programmed voltage is loaded on the appropriate addressing line by column, i.e. line SL(n) or SL(n+1) for a given column, and the programming pulse is applied to the gate lines by row, i.e., GL(m) or GL(m+1). For the selected array element in which the programmed voltage is applied and the gate line is pulsed, this turns on a switch transistor T1, and the circuit node connected to the electrode is charged to the programmed voltage. When GL is taken low, this voltage is preserved, stored on a storage capacitor C1 connected to the voltage supply VPIX. In contrast to the previous design of FIGS. 6 and 7, however, impedance sensing circuitry is not integrated into the array element circuitry itself, but rather is integrated into a column detection circuit 124 that is integrated into the thin film electronics.

As shown in the circuit diagram of FIG. 9A, each column includes first switches S1 that connect a corresponding column to the column actuation control circuit 122. Accordingly, for the example 2×2 array portion in FIG. 9, the first switches S1 include the switches S1(n) and S1(n+1) for the respective columns. Each column further includes, incorporated into the columns detection circuit 124, an addressing circuit, including in this example addressing circuit 123 for column(n), and addressing circuit 125 for column(n+1). In exemplary embodiments, each addressing circuit includes second switches S2, also referred to as input switches, that connect a corresponding column to an input voltage supply Vin that is inputted via the column detection circuit 124. The voltage input supply Vin is applied as part of the sensing operation as further detailed below. Accordingly, for the example 2×2 array portion in FIG. 9A, the second or input switches S2 include the switches S2(n) and S2(n+1) for the respective columns that connect to respective voltage inputs Vin(n) and Vin(n+1).

The column detection circuit 124 further includes for each column a measuring circuit, which in this example is measuring circuits 127 and 129. In exemplary embodiments, each measuring circuit includes third switches S3, also referred to as output switches, that connect a corresponding column to a current measurement circuit for each respective column that is incorporated in the column detection circuit 124. Accordingly, for the example 2×2 array portion in FIG. 9A, the third switches include the switch S3(n) that connects column(n) to a first current measurement circuit 126, and switch S3(n+1) that connects column(n+1) to a second current measurement circuit 128.

Referring to the circuit configuration of FIG. 9A in combination with the timing diagram of FIG. 10, sensing proceeds as follows. To perform sensing, the column line SL needs to be disconnected from the column actuation control circuit for the array elements involved in sensing so as to remove application of the programming and actuation voltages from the column actuation control circuit 122. In this example, a first switch for a column including an array element being sensed, e.g., first switches S1(n) and/or S1(n+1) depending on the array element being sensed, is open, shown as being low voltages in the timing diagram. In a mutual capacitance mode, a voltage input is perturbed on a first array element and a current output is measured from a second array element. In an example operation to sense array element (m, n), input switch S2(n) is closed (high voltage) and output switch S3(n) is open. This connects array element (m, n) to the voltage input Vin(n), and disconnects array element (m, n) from the first current measurement circuit 126. The output current is to be measured off of a second array element, such as for example the neighboring array element (m, n+1). For measuring the output current, input switch S2(n+1) is open and output switch S3(n+1) is closed (high voltage). This disconnects array element (m, n+1) from the voltage input Vin(n+1), and connects array element (m, n+1) to the second current measurement circuit 128. Although the second array element is adjacent to the first array element in this example, this need not be the case.

The circuit configuration operates to sense the capacitance between the element electrodes of pixel(m, n) and pixel(m, n+1). To perform such operation, the row addressing signal GL is used to select the row of the array element being sensed. For example, to sense row(m) this row is selected by maintaining GL(m) high, and for rows not being sensed, the GL lines (e.g., GL(m+1)) are maintained low. This high GL(m) voltage operates to turn on the switch transistors T1 in each array element of row(m), which provides capacitance coupling of the array elements in row(m). In addition, for pixel(m, n) the voltage input Vin(n) is connected to the array element electrode of said pixel through the select line SL(n), and for pixel(m, n+1) the second current measurement circuit 128 is connected to the array element electrode of said pixel through the select line SL(n+1).

In this embodiment, the circuit configuration operates in a mutual capacitance mode, i.e. the potential at one pixel electrode is perturbed, and the perturbation is measured at a different pixel electrode, i.e. the perturbing voltage signal is applied to column(n) and the coupled signal is sensed at column(n+1), either as a voltage or a current. In this example for sensing at pixel(m, n), Vin(n) is perturbed and the perturbation is measured at the second current measurement circuit 128 that has been connected to pixel(m, n+1). The quantity being measured is essentially the series combination of the capacitances between each of the element electrodes and the liquid droplet, i.e. CI1 in series with CI2 between the two column addressing lines. This is a measurement of the physical coverage of the liquid droplet over the two element electrodes for the respective array element. An output current "I" that is measured by the second current measurement circuit 128 is related to the capacitance "C" between the two array element electrodes and the perturbing of the potential VIN(n) by the relationship:

$$C = \frac{I}{\left(\frac{dVIN(n)}{dt}\right)}$$

As illustrated in the timing diagram of FIG. 10, the resultant output current will therefore depend on the coverage of the droplet with respect to the array element being sensed, and in particular whether the droplet is present or absent at the array element being sensed. The current measurement circuits 126 and 128 (and for all other columns) could be implemented by any one of several standard and well-known current measuring circuits. For example, the current measurement circuits may include a current integrator arrangement, a transimpedance amplifier, or a current sense amplifier.

To sense all rows of the device array, the sensing operation is repeated in turn for each of the (m) rows. In addition, to sense all columns in the array, the sensing may be performed between each neighboring pair of array element electrodes in sequence in comparable fashion, e.g. pairing column(n) and (n+1), then column(n+1) and (n+2), and so on until all array elements are sensed. For the columns not being sensed, the SL line may be floating or may be connected to a fixed potential, which preferably is a DC potential. In the example configuration of FIG. 9, the column detection circuit 124 and the column actuation control circuit 122 are shown as being located on opposite sides of the device array, but this specific positioning need not be the case so along as the appropriate electrical connections are present.

Figure 9B:
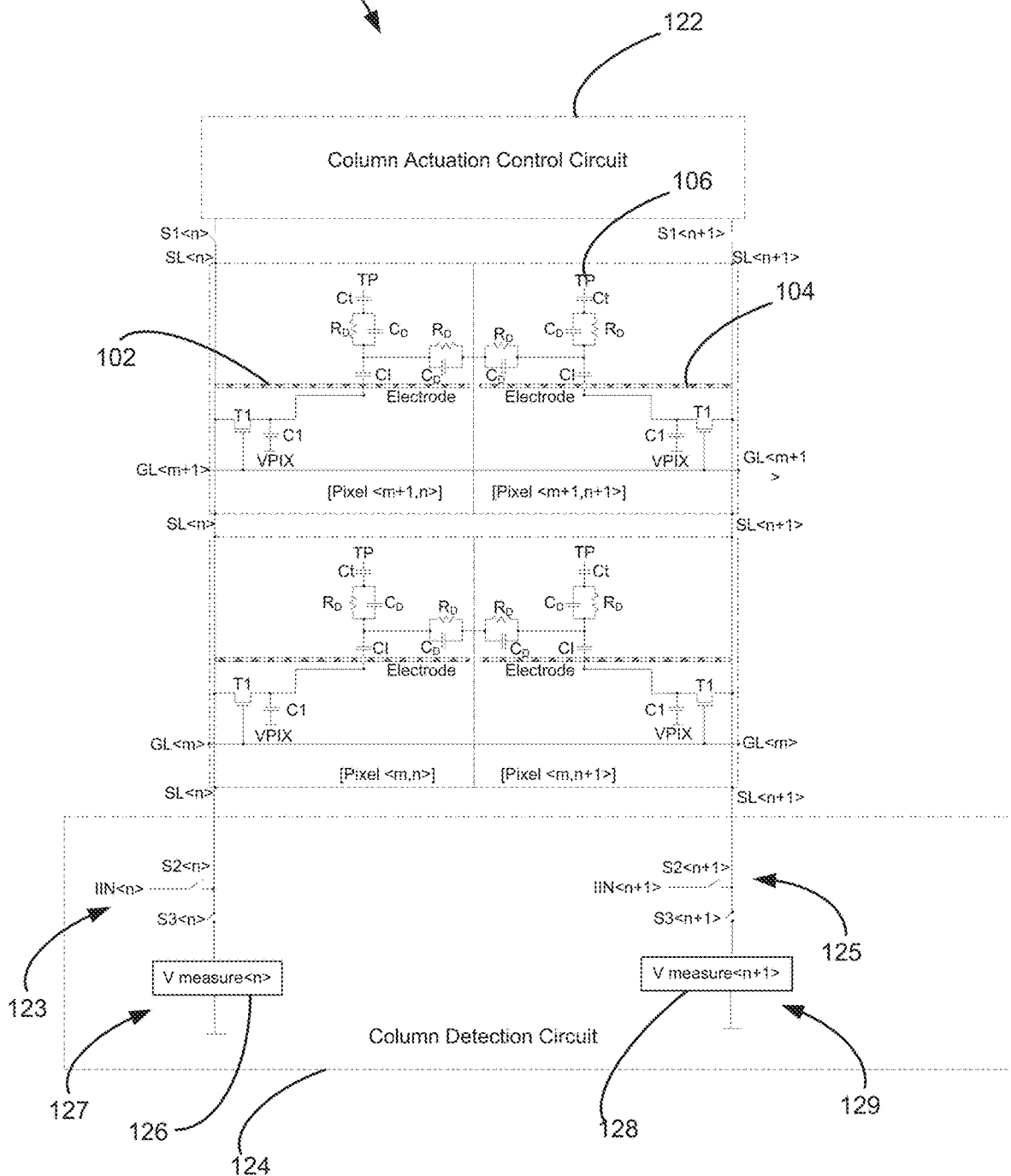
Figure 10:
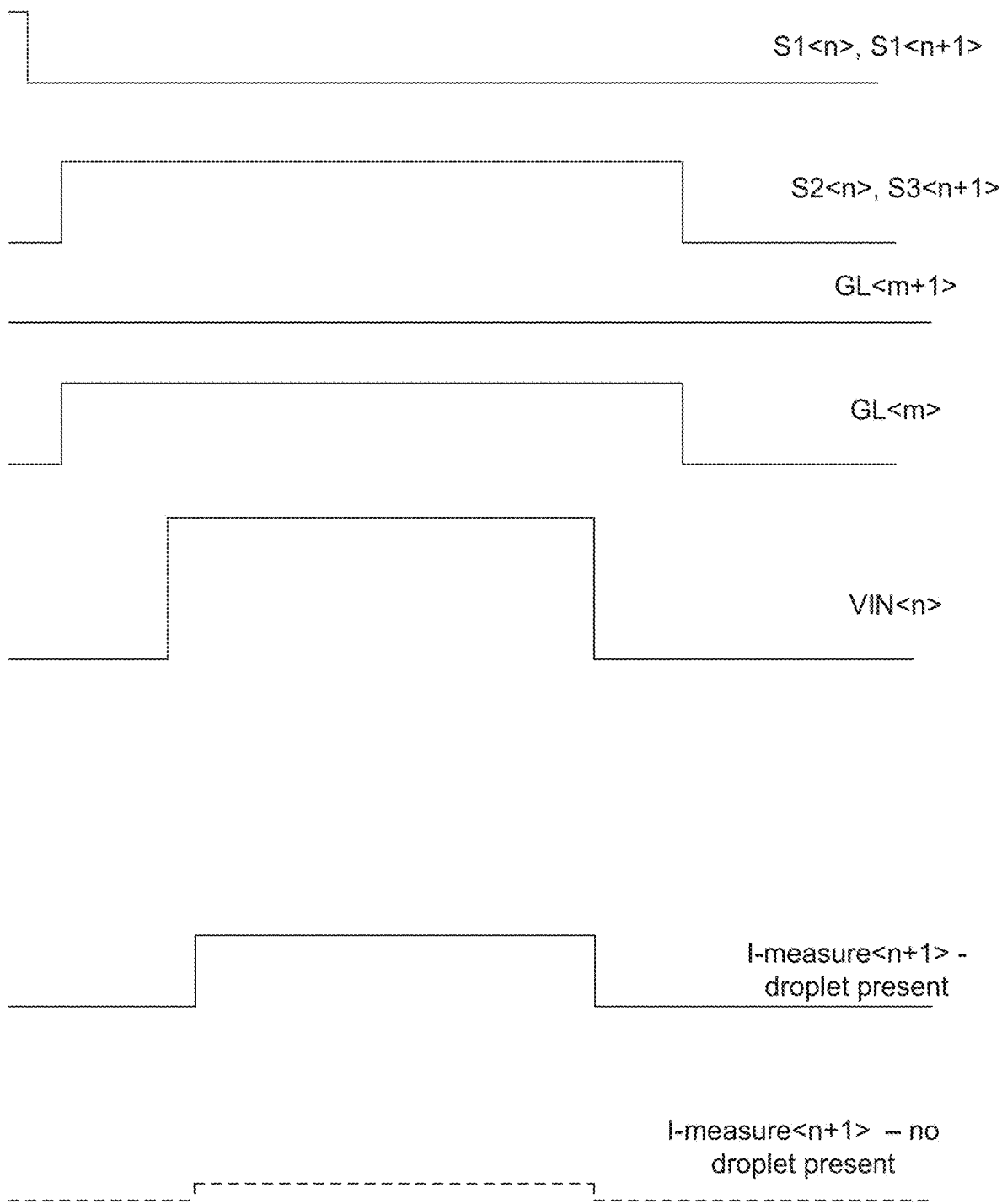
FIG. 10 is a timing diagram that illustrates the operation of the embodiment of FIG. 9.

In an alternative implementation, the arrangement of FIG. 9A could be slightly modified so as to replace the input voltage signal VIN<n> with a time dependent input current, IIN, and the measurement circuit with a voltage measurement circuit V measure, as shown FIG. 9B. IIN<n> could, for example, be realized by a simple current source (e.g. a current mirror) of standard construction and switched onto the column line. Operation of the circuit would be similar, with the input signal coupled from column <n> to column <n+1> to an extent determined by the coupling impedance between the electrodes of the pixels being sensed.

An advantage of the embodiments over conventional configurations is that sensing the capacitance present at each array element in the device array is performed without requiring additional circuit elements to be integrated specifically into the array element circuitry. In this manner, a very small pixel circuit can implement electrowetting actuation and sensing using a 1T/1C array element circuitry configuration as shown in FIGS. 9A (and 9B), by delocalizing the sensor function into the column detection circuit. There remains substantial sensing integration, however, as the sensing function is integrated into the column detection circuit within the thin film electronics layer deposited on the element electrode layer. In this manner, substantial benefits of integrated sensing are achieved, such as for example closed loop functioning and high signal-to-noise ratio, without having to increase the size of the array element circuitry in each individual array element as desired for high resolution applications and increased yield. Another potential advantage is that the described circuit configuration and operation measures the capacitance directly between a pair of element electrodes, rather than the capacitance present at a single electrode which is the case with the capacitance sensor being integrated into the array element circuitry. Such measurement of capacitance between element electrodes may be beneficial, for example, for determining more precisely the extent to which a droplet overlaps between two pixels. This may facilitate a more accurate measurement of droplet size and other droplet properties.

Figure 11:
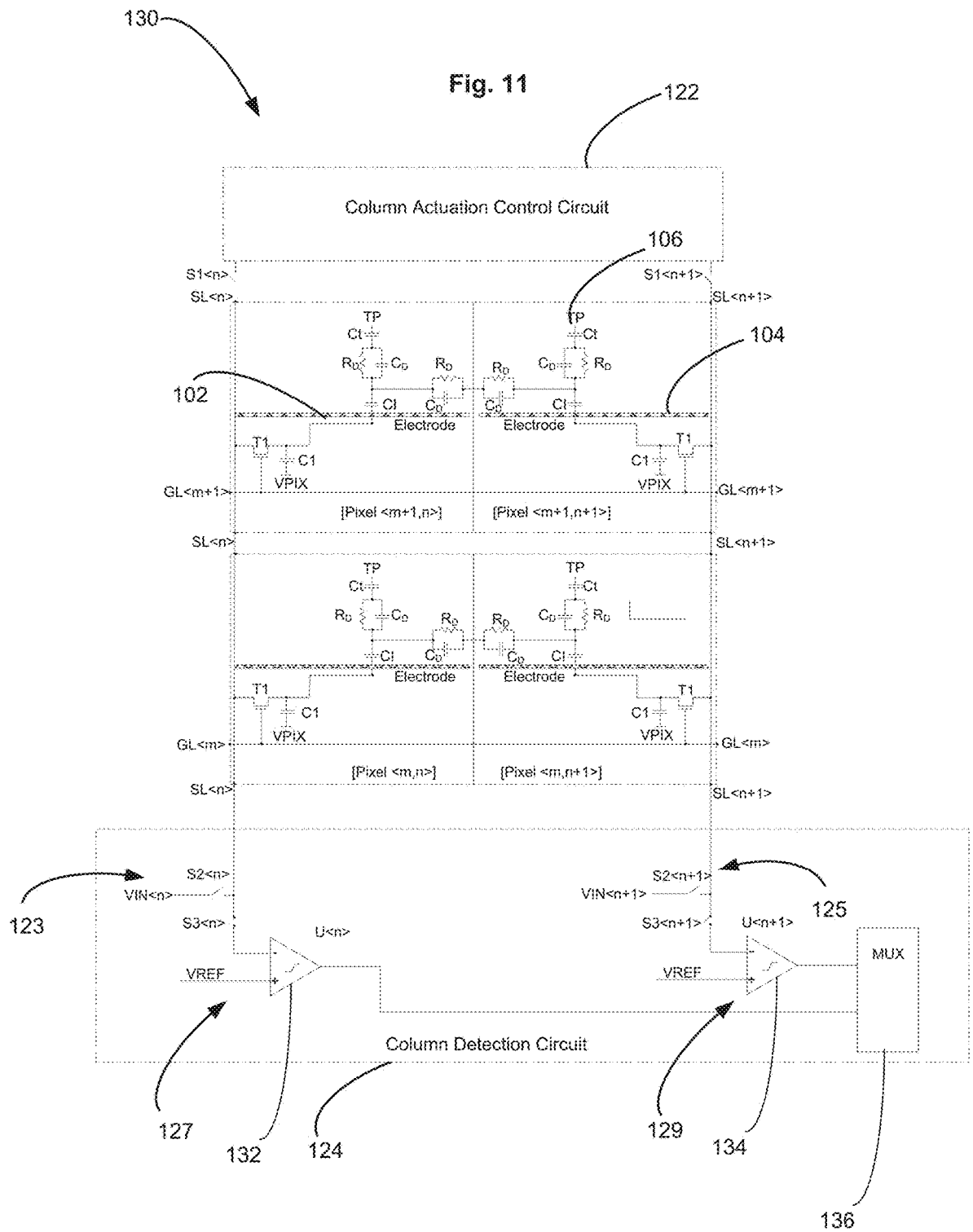
FIG. 11 is a drawing depicting a plurality of array elements including exemplary array element circuitry for an AM-EWOD device, which is a variation on the embodiment of FIG. 9 that employs alternative output measuring circuitry.
Figure 12:
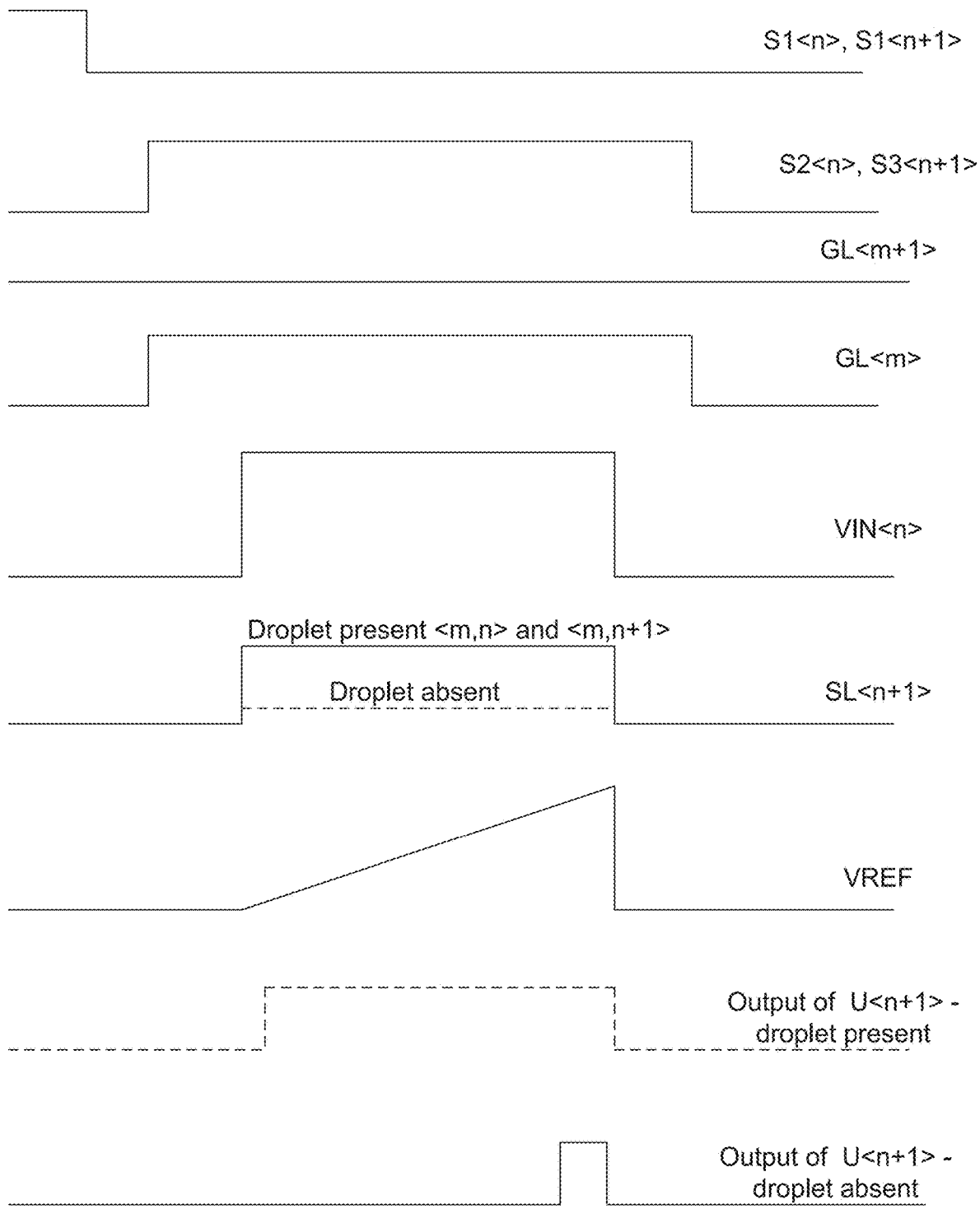
FIG. 12 is a timing diagram that illustrates the operation of the embodiment of FIG. 11.

FIG. 11 is a drawing depicting a plurality of array elements 130 including exemplary array element circuitry for an AM-EWOD device, which is a variation on the embodiment of FIG. 9 that employs alternative output measuring circuitry. FIG. 12 is a timing diagram that illustrates the operation of the embodiment of FIG. 11. The array element circuitry is generally configured comparably as in the previous embodiment. FIG. 11 also depicts a 2×2 array portion of rows ($m_i$) and columns ($n_j$), and thus the example array portion includes the following set of array elements: pixel (m, n); pixel (m+1, n); pixel (m, n+1), and pixel (m+1, n+1). FIG. 11 further includes the circuit representations of the liquid droplet and device layers similarly as are illustrated in FIG. 9. Accordingly, like elements are identified with like reference numerals as in FIG. 9. In addition, programming and actuation is performed essentially as previously described.

Sensing also proceeds comparably as in the previous embodiment. Referring to the circuit configuration of FIG. 11 in combination with the timing diagram of FIG. 12, to perform sensing, the column line SL for the columns being sensed is disconnected from the column actuation control circuit 122 for the array elements involved in sensing. Accordingly, the first switch of the column including the array element being sensed, S1(n) or S1(n+1), is open. In an example operation to sense array element (m, n), switch S2(n) is closed (high voltage) and S3(n) is open. This connects array element (m, n) to the voltage input Vin(n), and disconnects array element (m, n) from the first measuring circuit 127. The output signal is to be measured off of a second array element, such as for example the neighboring array element (m, n+1). For measuring the output signal, S2(n+1) is open and S3(n+1) is closed (high voltage). This disconnects array element (m, n+1) from the voltage input Vin(n+1), and connects array element (m, n+1) to the second measuring circuit 129. The row addressing signal GL is used to select the row of the array being sensed. For example, to sense row(m) this row is selected by maintaining GL(m) high, and for rows not being sensed, the GL lines (e.g., GL(m+1)) are maintained low. This high GL(m) voltage operates to turn on the switch transistors T1 in each array element of row(m) to provide capacitance coupling of the array element in row(m) between the associated columns addressing lines. In addition, for pixel(m, n) the voltage input Vin(n) is connected to the array element electrode of said pixel through the select line SL(n), and for pixel(m, n+1) the second measuring circuit is connected to the array element electrode of said pixel through the select line SL(n+1). Comparable operation may be performed to sensed array elements in the other rows and columns.

The embodiment of FIGS. 11 and 12 varies principally in the nature of the output signal measurement. In particular, the measuring circuits 127 and 129 each includes a comparator circuit "U" by which the output signal is compared to a reference voltage input VREF. For the two columns shown, corresponding comparator circuits 132 for U(n), and 134 for U(n+1), are shown. For example, when column(n) is sensed whereby the perturbation is applied to the SL(n) line at Vin(n) and the output signal is measured from the SL(n+1) line, said output signal is applied to the comparator circuit U(n+1). The comparator produces a digital output whose value depends upon which of its input terminals is at a higher potential. In the example of this embodiment, as shown in the timing diagram of FIG. 12, a reference voltage VREF having a sawtooth waveform is applied to the (+) input of the comparator circuit, which is compared to the output column voltage applied down SL(n+1). Accordingly, the pulse width of the comparator output is a digitized representation of the voltage potential appearing on SL(n+1), and therefore is a measure of the capacitance between the electrodes of the pair of pixels being measured as the output SL(n+1) will differ depending upon the presence or absence of a droplet. The voltage output of comparator circuits from multiple columns may be combined for readout, for example by being coupled through a multiplexer (MUX) 136 incorporated into the column detection circuit 124 for readout off the device array. Optionally, the comparator circuit outputs may be otherwise digitally processed on or off the device array by standard signal processing means.

Similarly as above, to sense all rows of the array, the sensing operation is repeated in turn for each of the (m) rows. In addition, to sense all columns in the array, the sensing may be performed between each neighboring pair of array element electrodes in sequence in comparable fashion, e.g. pairing column(n) and (n+1), then column(n+1) and (n+2), and so on until all array elements are sensed. For the columns not being sensed, the SL line may be floating or may be connected to a fixed potential, which preferably is a DC potential.

Figure 13:
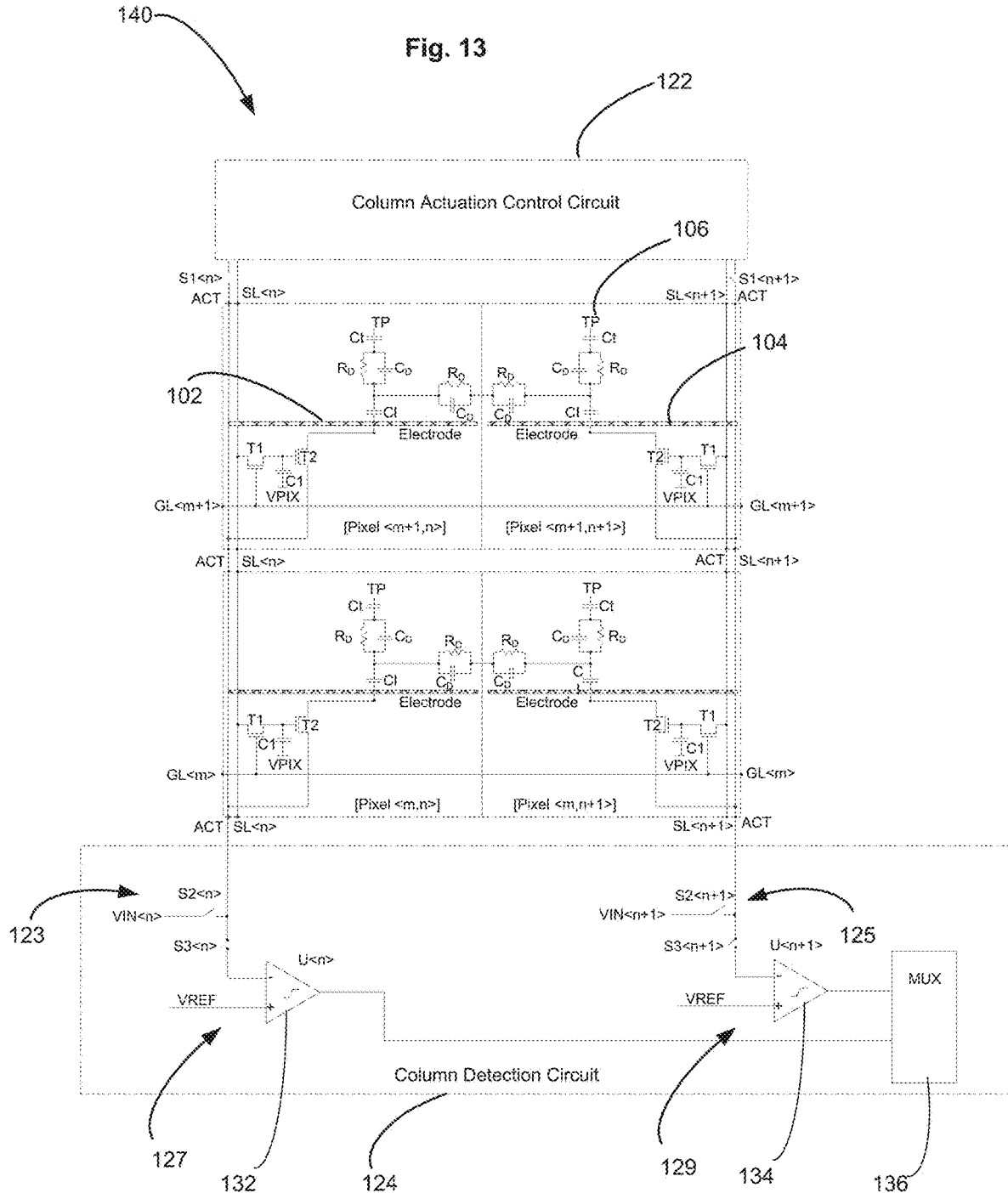
FIG. 13 is a drawing depicting a plurality of array elements including exemplary array element circuitry for an AM-EWOD device, which is a variation on the embodiment of FIG. 11 that employs alternative actuation circuitry.
Figure 14:
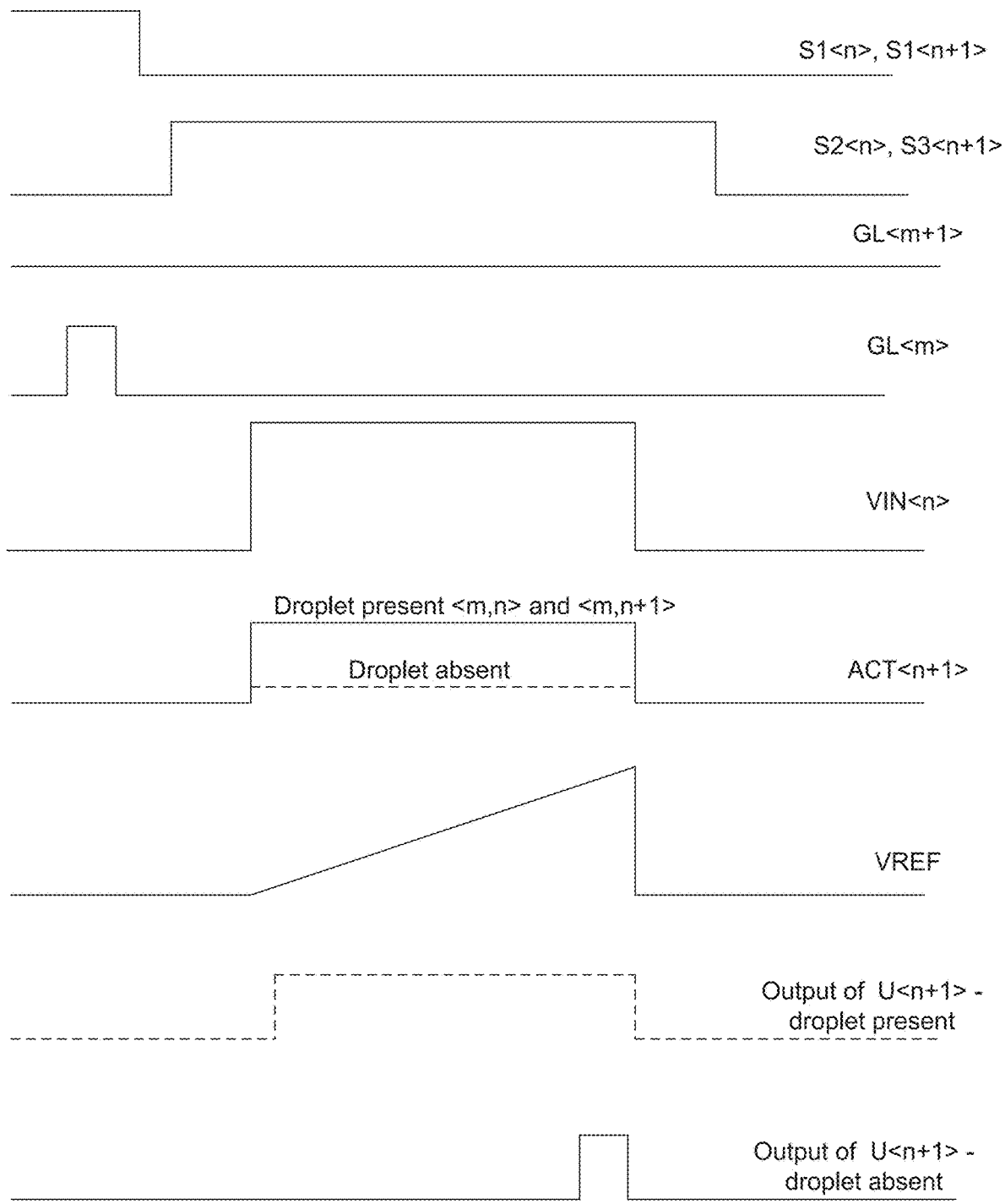
FIG. 14 is a timing diagram that illustrates the operation of the embodiment of FIG. 13.

FIG. 13 is a drawing depicting a plurality of array elements 140 including exemplary array element circuitry for an AM-EWOD device, which is a variation on the embodiment of FIG. 11 that employs alternative actuation circuitry. FIG. 14 is a timing diagram that illustrates the operation of the embodiment of FIG. 13. The array element circuitry is generally configured comparably as in previous embodiments. FIG. 13 also depicts a 2×2 array portion of rows ($m_i$) and columns ($n_i$), and thus the example array portion includes the following set of array elements: pixel (m, n); pixel (m+1, n); pixel (m, n+1); and pixel (m+1, n+1). FIG. 13 further includes the circuit representations of the liquid droplet and device layers similarly as are illustrated in previous figures. Accordingly, like elements are identified with like reference numerals as in previous figures.

The actuation and programming of such circuit configuration is described in Applicant's commonly assigned US 2017/0076676 referenced above including a 2-transistor 1-capictor actuation circuit configuration. To program a given array element by writing voltage data to said array element, a voltage is loaded onto addressing line SL for the column to be actuated, and a pulse is applied to the gate line GL appropriate for the row being programmed. This turns on switch transistor T1 in the selected row, and the circuit node connected to the electrode is charged to the voltage pulse on the SL line. When GL is taken low, this voltage is preserved, stored on the additional capacitor C1 to which there also is applied an input voltage VP IX. With this arrangement, the stored voltage on C1 determines whether a second transistor, transistor T2, is on, and when transistor T2 is on the element electrode is connected to the desired actuation voltage line ACT. This arrangement is particularly suitable for an AC actuation voltage as the SL voltage is merely a switching pulse, and an additional AC actuation voltage can be applied along the separate voltage input line ACT.

Sensing proceeds comparably as in the previous embodiment using the comparator circuits and a multiplexer MUX for combining results of different columns, except that the output is read off of the ACT(n+1) line. Referring to the circuit configuration of FIG. 13 in combination with the timing diagram of FIG. 14, to perform sensing, the column line SL for the columns being sensed is disconnected from the column actuation control circuit for the array elements involved in sensing. Accordingly, the first switch of the column including the array element being sensed, S1($n$) or S1($n$+1), is open. In an example operation to sense array element (m, n), input switch S2($n$) is closed (high voltage) and output switch S3($n$) is open. This connects array element (m, n) to the voltage input Vin(n), and disconnects array element (m, n) from the first measuring circuit 127. The output signal is to be measured off of a second array element, such as for example the neighboring array element (m, n+1). For measuring the output signal, input S2($n$+1) is open and output S3($n$+1) is closed (high voltage). This disconnects array element (m, n+1) from the voltage input Vin(n+1), and connects array element (m, n+1) to the second measuring circuit 129. The row addressing signal GL is used to select the row of the array being sensed. For example, to sense row(m) this row is selected by maintaining GL(m) high, and for rows not being sensed, the GL lines (e.g., GL(m+1)) are maintained low. This high GL(m) voltage operates to turn on the switch transistors T1 in each array element of row(m), and thus the array elements a capacitively coupled. In addition, for pixel(m, n) the voltage input Vin(n) is connected to the array element electrode of said pixel through the actuation voltage line ACT(n), and for pixel(m, n+1) the second current measurement circuit is connected to the array element electrode of said pixel through the actuation line ACT(n+1). Comparable operation may be performed to sense array elements in the other columns.

The embodiment of FIGS. 13 and 14 also employs the comparator circuits 132 for U(n), and 134 for U(n+1). In an example when column(n) is sensed whereby the perturbation is applied to the ACT(n) line by Vin(n) and the output signal is measured from the ACT(n+1) line, said output signal is applied to the comparator circuit U(n+1). The sawtooth reference voltage VREF is applied to the (+) input of the comparator circuit, which is compared to the output column voltage applied down ACT(n+1). Accordingly, the pulse width of the comparator output is a digitized representation of the voltage potential appearing on ACT(n+1), and therefore is a measure of the capacitance between the electrodes of the pair of pixels being measured as the output ACT(n+1) will differ depending upon the presence or absence of a droplet. The voltage output of comparator circuits from multiple columns again may be combined for readout, for example by being coupled through a multiplexer (MUX) 136 for readout off the device array. Optionally, the comparator circuit outputs may be otherwise digitally processed on or off the device array by standard signal processing means.

Similarly as above, to sense all rows of the array, the sensing operation is repeated in turn for each of the (m) rows. In addition, to sense all columns in the array, the sensing may be performed between each neighboring pair of array element electrodes in sequence in comparable fashion, e.g. pairing column(n) and (n+1), then column(n+1) and (n+2), and so on until all array elements are sensed. For the columns not being sensed, the SL/ACT lines may be floating or may be connected to a fixed potential, which preferably is a DC potential.

In exemplary embodiments, multiple "pairs" of pixels may be sensed simultaneously, e.g. a capacitance between column(n) and (n+1) is sensed at the same time as the capacitance between columns (n+2) and (n+3). A further aspect of this embodiment is that maximum sensor resolution may be achieved by sensing odd and even pairs in combination at during different time periods or intervals. Accordingly, a typical operation would be:

|  | Signal Perturbed From Column | Signal Measured By Column |
| --- | --- | --- |
| Sensed at Time A | N | N + 1 |
|  | N + 2 | N + 3 |
|  | N + 4 | N + 5 |
|  | Etc. | Etc. |
| Sensed at Time B | N + 1 | N + 2 |
|  | N + 3 | N + 4 |
|  | N + 5 | N + 6 |
|  | Etc. | Etc. |

This method of operation has an advantage of maximizing efficiency by sensing in a minimum amount of time, and also maximizing resolution by sensing between each pair of columns.

Figure 15:
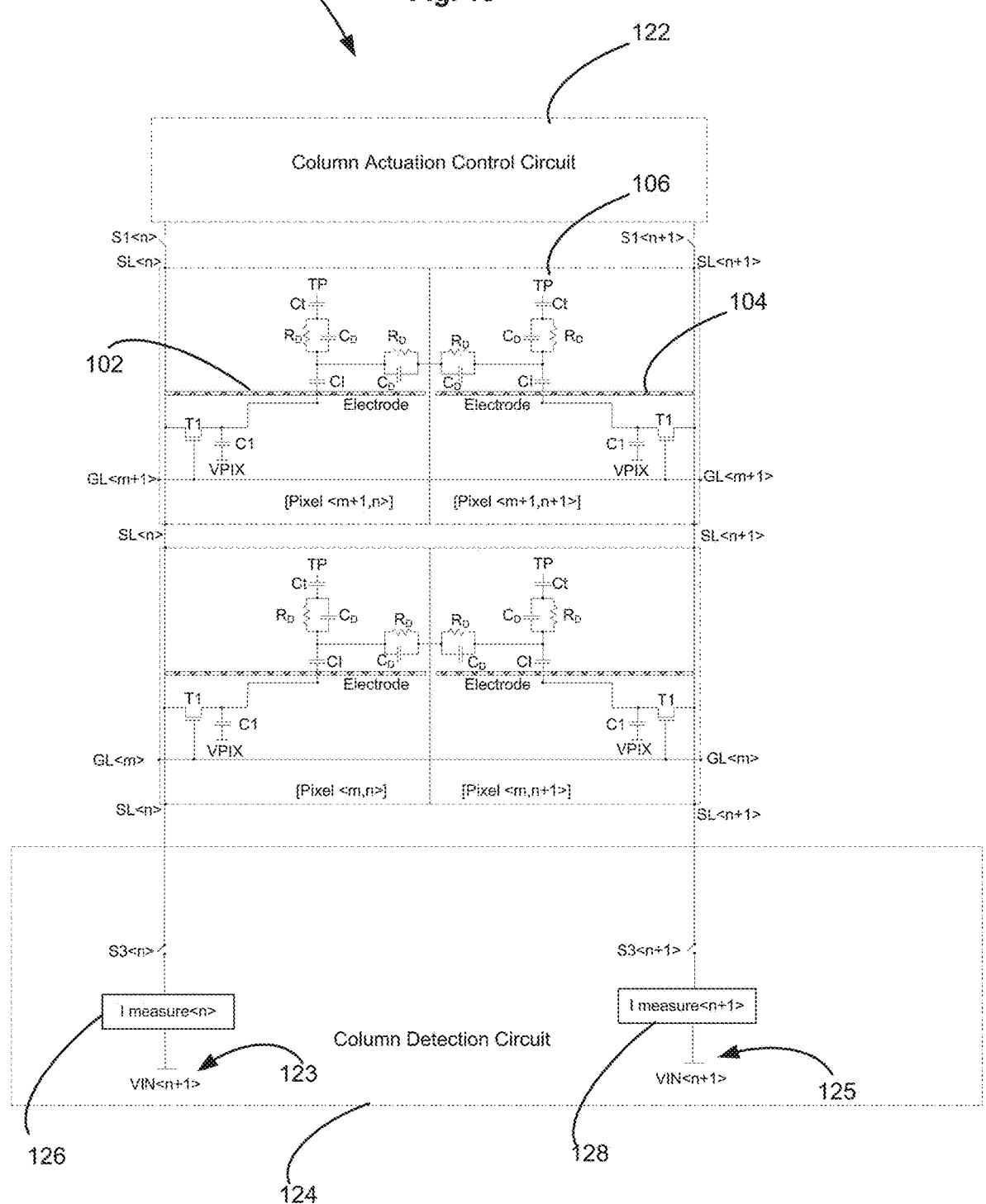
FIG. 15 is a drawing depicting a plurality of array elements including exemplary array element circuitry for an AM-EWOD device, which employs a self-capacitance sensing mode.

As another example of enhanced circuit embodiments for sensing, FIG. 15 is a drawing depicting a plurality of array elements 150 including exemplary array element circuitry for an AM-EWOD device in accordance with embodiments of the present invention. FIG. 16 is a timing diagram that illustrates a sensing operation of the embodiment of FIG. 15. Like the previous embodiments, FIG. 15 depicts a 2×2 array portion of rows ($m_i$) and columns ($n_i$), and thus the example array portion includes the following set of array elements: pixel (m, n); pixel (m+1, n); pixel (m, n+1); and pixel (m+1, n+1). FIG. 15 further includes the circuit representations of the liquid droplet and device layers similarly as are illustrated in previous figures. Accordingly, like elements are identified with like reference numerals as in the previous figures. In addition, programming and actuation is performed essentially as previously described.

In the embodiment of FIG. 15, the circuit arrangement is configured to perform in a self-capacitance mode, in which the perturbing potential and the measured output current are coupled to the same terminal of the measured capacitance within a same or common column line. For example, when sensing column(n) the SL line of the non-sensing column (n+1) (and optionally SL lines of other non-sensing columns in the array) is connected to a fixed potential, and preferably a DC potential, during sensing. In this example, this is achieved by closing switch S1(n+1) for the non-sensing column and supplying the DC potential from the column actuation control circuit 122.

Referring to the circuit configuration of FIG. 15 in combination with the timing diagram of FIG. 16, sensing proceeds as follows. To perform sensing, the column line SL of the column being sensed is disconnected from the column actuation control circuit so as to remove application of the programming and actuation voltages from the column actuation control circuit 122. In this example, first switch S1(n) is open, shown as being a low voltage in the timing diagram. In a self-capacitance mode, a voltage input is perturbed on a first array element and a current output is measured from the same first array element. Accordingly, the second switches S2 of previous embodiments are omitted in the configuration of FIG. 15, and the input voltage Vin and the associated current measurement circuit are commonly connected through the example third switches S3 for each column. In an example operation to sense array element (m, n), switch S3(n) is closed. This connects array element (m, n) to the voltage input Vin(n) through the first current measurement circuit 126. The output current is to be measured off of this same first array element. Similarly, for sensing array elements in column(n+1), the switch S3(n+1) is closed such that the voltage input Vin(n+1) is connected through the second current measurement circuit 128.

To perform the sensing operation, the row addressing signal GL is used to select the row of the array being sensed. For example, to sense row(m) this row is selected by maintaining GL(m) high, and for rows not being sensed, the GL lines (e.g., GL(m+1)) are maintained low. This high GL(m) voltage operates to turn on the switch transistors T1 in each array element of row(m) which capacitively couples the array elements in that row. In addition, for pixel(m, n) the voltage input Vin(n) is connected to the array element electrode of said pixel through the select line SL(n). In this embodiment, the circuit configuration operates in a self-capacitance mode, i.e. the potential at one pixel electrode is perturbed, and the perturbation is measured at the same pixel electrode, i.e. the perturbing voltage signal is applied to column(n) and the coupled current output is sensed at column(n). In this example for sensing at pixel(m, n), Vin(n) is perturbed and the perturbation is measured at the first current measurement circuit 126 on the same column line. This constitutes a measurement of the physical coverage of the liquid droplet over the array element being sensed. As illustrated in the timing diagram of FIG. 16, the resultant output current will similarly depend on the coverage of the droplet with respect to the array element being sensed, and in particular whether the droplet is present or absent at the array element being sensed.

To sense all rows of the array, the sensing operation is repeated in turn for each of the (m) rows. In addition, to sense all the columns in the array, the sensing may be performed sequentially by performing self-capacitance measurements for array elements in each column in turn. For the columns not being sensed, the SL line again may be floating or may be connected to a fixed potential, which preferably is a DC potential. In the example configuration of FIG. 15, the column detection circuit 124 and the column actuation control circuit 122 are shown as located on opposite sides of the device array, but again this specific positioning need not be the case so along as the appropriate electrical connections are present. In addition, comparator circuits and a multiplexer MUX circuit also may be used in a self-capacitance mode.

An advantage of the self-capacitance mode is that the measurement signal will tend to be higher than in the mutual capacitance mode described above, as in the mutual capacitance mode the measured capacitance will include contributions from all pixels surrounding the pixel undergoing sensing. Self-capacitance operation may be beneficial if the pixels are very small, and hence the capacitance and measured currents are small for increasing the signal-to-noise ratio of the measurement. Accordingly, in the self-capacitance mode, the quantity being measured is essentially the capacitance present at the array element electrode being sensed, which is primarily a function of the coverage of the droplet over the electrode which relates to droplet size.

Figure 17:
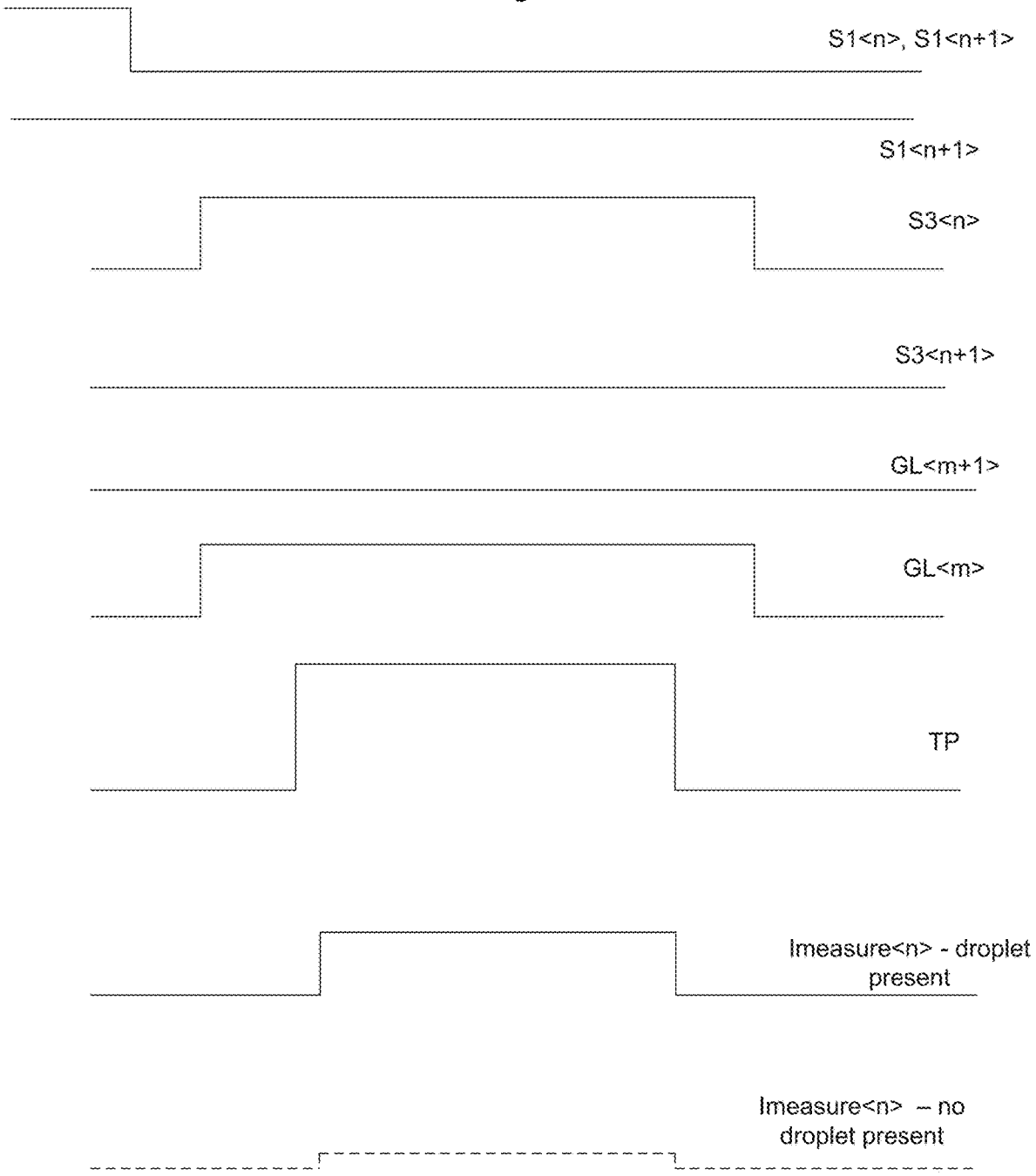
FIG. 17 is a timing diagram that illustrates the operation of the embodiment of FIG. 15 in an alternative mutual capacitance mode.

In a variation of such embodiment using the circuit configuration of FIG. 15, such circuit configuration alternatively may be operated in a modified form of the mutual capacitance mode. Such mode is illustrated in the timing diagram of FIG. 17. For this modified mutual capacitance sensing, the perturbation voltage is applied by perturbing the voltage applied to the reference (Top) electrode 106 (TP). The column actuation control circuit 122 is disconnected on all columns (S1 open on all columns) during sensing. In addition, the current measurement circuit is connected in all columns, meaning S3 also is closed on all columns. Take an example in which array elements on row(m) are to be sensed. As shown in FIG. 17, row(m) is selected for sensing by taking the line GL(m) high, which connects the array element electrode of the selected row to the current measurement circuit by turning on T1. As referenced above, sensing is performed by applying a voltage pulse perturbation to the reference electrode TP. The TP voltage perturbation couples via the cell gap including any droplet (if present) so that a voltage pulse also appears at the array element electrode, the magnitude of which is dependent on the capacitance between the element electrode and the reference electrode, which in turn depends upon whether or not a droplet is present. The element electrode is connected through T1 to the line SL(n), and thus the perturbation is measured in the column detection circuit as previously described. Such operation may be repeated for sensing the different array elements across the device array.

For mutual capacitance modes of operation, the methods of perturbing and sensing electrodes of adjacent array elements may be expanded into perturbing and sensing groups of element electrodes. The result is to increase the size of coupling capacitance to generate a larger output signal. Relatedly, a larger output signal can be achieved by a combined output of multiple array elements, and this permits the device to be less turned on when a larger sensing output is coming through. Various combinations of sensing and perturbing multiple array elements may be employed to generate a larger sensing output. Examples include (without limitation): sensing multiple array elements with a common Vin perturbation spanning multiple elements; sensing multiple array elements with a single Vin perturbation from a neighbor array element; sensing multiple array elements with multiple Vin perturbation signals from multiple array elements; sensing a single array element with multiple Vin perturbation signals from multiple neighboring elements; and perturbing multiple array elements on different sides or a same side of an array element being sensed, or sequentially on different sides so as to provide additional position information on a droplet layout.

Figure 18:
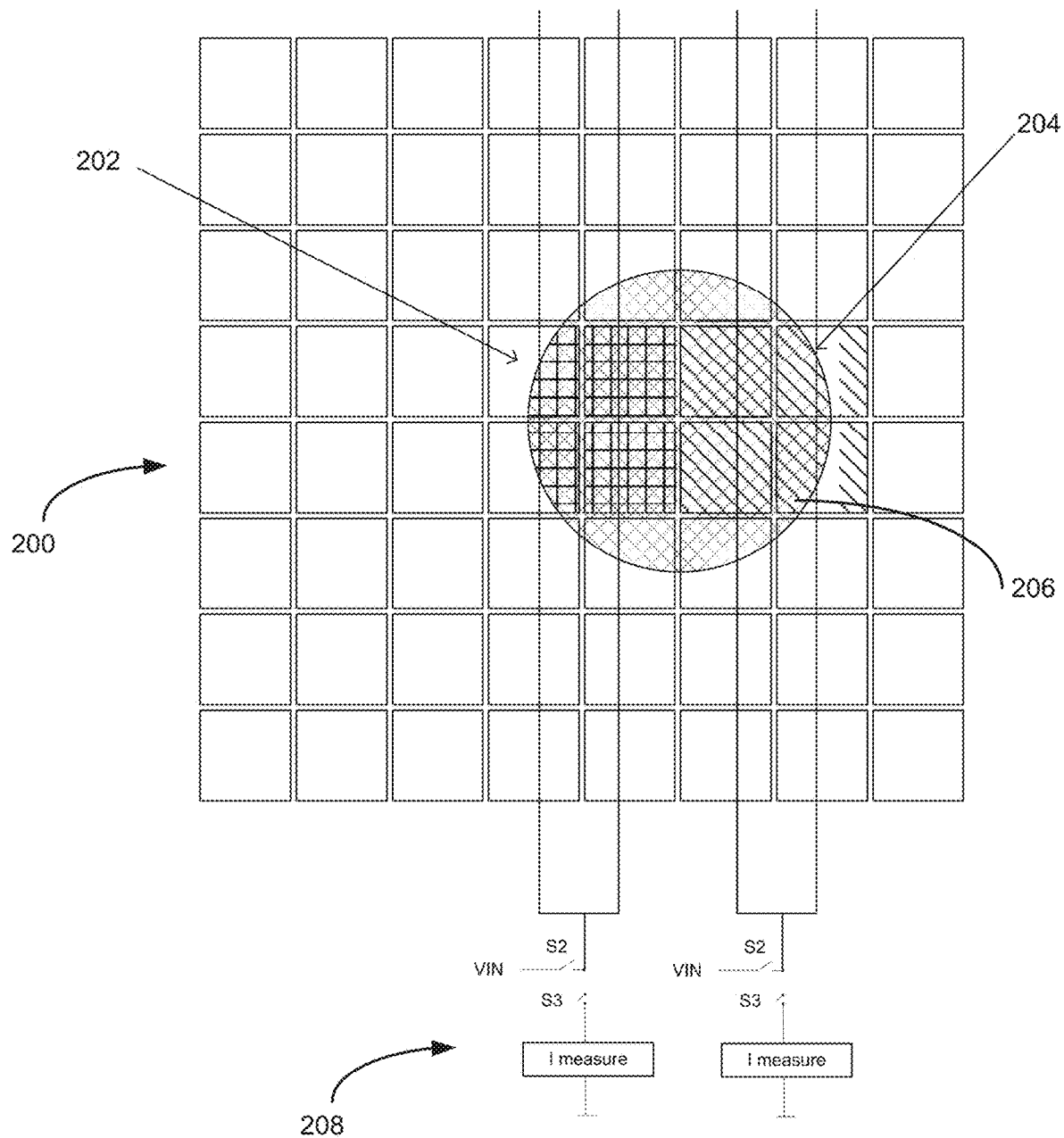
FIG. 18 is a drawing depicting an exemplary operation that employs perturbing and sensing over multiple array elements in an element array.

For example, FIG. 18 is a drawing depicting an exemplary operation that employs perturbing and sensing over multiple array elements in an element array 200. In this example, a first grouping 202 of 2×2 array elements is perturbed, and the resulting output signal is read from a second and adjacent grouping 204 of 2×2 array elements being sensed. The two array element groupings are depicted relative to a droplet 206. It will be appreciated that any suitable number of array elements may be included in the perturbing group and the sensing group, and the number of array elements maybe be the same or different in the two groups. The output signal is read by readout circuitry 208 that is switchable to read the desired output signal as described above. In such an embodiment, increasing the number of array elements being perturbed and/or read out increases the coupling capacitance to produce a larger output signal. Different perturbing and sensing array element combinations may be employed as identified above. In the example shown in FIG. 18 a 2×2 block of pixels is shown as being perturbed and being sensed. Any suitable number may be employed, and the pixels in each block do not necessarily need to be adjacent or even contiguous. An advantage of combining pixels for perturbing and/or sensing is that such operation may be used to increase measurement signal-to-noise ratio. This occurs because a larger signal is coupled between the two groups of element electrodes because of the larger area of each group relative to individual pixels, and the greater capacitance between the groups.

An aspect of the invention, therefore, is an active matrix electro-wetting on dielectric (AM-EWOD) device including a column detection circuit that performs a sensing function based on measured capacitance variations between addressing lines that provide control signals to the array elements. In exemplary embodiments, the AM-EWOD device includes a plurality of array elements arranged in an array of rows and columns; each column including a column addressing line that applies control signals to a corresponding column of array elements, and each row including a row addressing line that applies control signals to a corresponding row of array elements, each array element including an element electrode for receiving an actuation voltage and a switch transistor, wherein the switch transistor is electrically connected between the column addressing line and the element electrode and is switched by the row addressing line; and a column detection circuit comprising an addressing circuit that applies an electrical perturbation during a sensing operation to the column addressing line of an array element being sensed, and a measuring circuit that measures an output signal from one of the column addressing lines, wherein the output signal varies based upon a capacitance present at the element electrode. The AM-EWOD device may include one or more of the following features, either individually or in combination.

In an exemplary embodiment of the AM-EWOD device, the measuring circuit is configured to measure the output signal from a column addressing line that corresponds to a different column addressing line from the array element being sensed.

In an exemplary embodiment of the AM-EWOD device, the measuring circuit is configured to measure the output signal from a column addressing that corresponds to the same column addressing as the array element being sensed.

In an exemplary embodiment of the AM-EWOD device, the addressing circuit comprises an input switch that closes to connect a voltage input to the column addressing line of the array element being sensed, wherein the voltage input is perturbed for the array element being sensed.

In an exemplary embodiment of the AM-EWOD device, the measuring circuit comprises a current measuring circuit and an output switch that closes to connect the current measuring circuit to the column addressing line of the output signal, and the output signal is an output current measured by the current measuring circuit.

In an exemplary embodiment of the AM-EWOD device, the measuring circuit includes a comparator circuit that compares the output signal to a reference voltage input and an output switch that closes to connect the comparator circuit to the column addressing line of the output signal, and an output voltage is outputted by the comparator circuit based on the comparison.

In an exemplary embodiment of the AM-EWOD device, the column detection circuit further includes a multiplexer that combines outputs of comparator circuits of multiple columns.

In an exemplary embodiment of the AM-EWOD device, an array element being sensed is selected by a control signal applied to the row addressing line of the array element being sensed.

In an exemplary embodiment of the AM-EWOD device, the column detection circuit is integrated onto a thin film electronics substrate with the array element electrodes.

In an exemplary embodiment of the AM-EWOD device, the AM-EWOD device further includes a column actuation control circuit configured to apply actuation voltages to the element electrodes for actuating the array elements; and a switch for disconnecting the column actuation control circuit from the array element being sensed during the sensing operation of the array element being sensed.

In an exemplary embodiment of the AM-EWOD device, the column detection circuit and the column actuation control circuit are integrated onto a thin film electronics substrate with the array element electrodes.

In an exemplary embodiment of the AM-EWOD device, each array element includes actuation circuitry configured to apply the actuation voltage to the element electrode for actuating the array element, and the actuation circuit includes the switch transistor and a storage capacitor for storing a programming voltage applied through the switch transistor for actuating the array element.

In an exemplary embodiment of the AM-EWOD device, the AM-EWOD device further includes a second transistor having a gate connected to the capacitor, wherein the programming voltage stored on the storage capacitor controls the second transistor and the actuation voltage is applied through the second transistor to the element electrode.

In an exemplary embodiment of the AM-EWOD device, the AM-EWOD device further includes a reference electrode spaced apart from the element electrodes to form a cell gap, an actuation voltage for actuating an array element being a potential difference between the element electrode and the reference electrode of said array element, wherein during the sensing operation the voltage perturbation is applied to the reference electrode.

Another aspect of the invention is a method of operating the AM-EWOD device to perform a sensing function, which may sense droplet and/or device properties based on measured capacitance variations between addressing lines that provide control signals to the array elements. In exemplary embodiments, the method of operating includes: arranging a plurality of array elements in an array of rows and columns, each column including a column addressing line that applies control signals to a corresponding column of array elements, and each row including a row addressing line that applies control signals to a corresponding row of array elements; providing a column detection circuit comprising an addressing circuit and a measuring circuit; and performing a sensing operation by the steps of: applying a voltage perturbation from the addressing circuit to the column addressing line of an array element being sensed; and measuring an output signal with the measuring circuit from one of the column addressing lines, wherein the output signal varies based upon a capacitance present at an array element electrode of the array element being sensed. The method of operating may include one or more of the following features, either individually or in combination.

In an exemplary embodiment of the method of operating, the measuring circuit measures the output signal from a column addressing line that corresponds to a different column addressing line from the array element being sensed.

In an exemplary embodiment of the method of operating, the measuring circuit measures the output signal from a column addressing that corresponds to the same column addressing as the array element being sensed.

In an exemplary embodiment of the method of operating, the method further includes selecting an array element being sensed by applying a control signal to the row addressing line of the array element being sensed.

In an exemplary embodiment of the method of operating, the method further includes integrating the column detection circuit onto a thin film electronics substrate with the array element electrodes of the array elements.

In an exemplary embodiment of the method of operating, applying the voltage perturbation comprises perturbing a voltage to a first group of array elements element being sensed, and measuring the output signal comprises measuring the output signal from a second group of array elements that is different from the first group of array elements.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The described embodiments could be used to provide an enhance AM-EWOD device. The AM-EWOD device could form a part of a lab-on-a-chip system. Such devices could be used for optical detection of biochemical or physiological materials, such as for cell detection and cell counting. Applications include healthcare diagnostic testing, material testing, chemical or biochemical material synthesis, proteomics, tools for research in life sciences and forensic science.

REFERENCE SIGNS LIST

32—reader
34—cartridge
35—external sensor module
36—AM-EWOD device
38—control electronics
40—storage device
44—lower substrate assembly
46—thin film electronics
48—array element electrodes
48A—array element electrode
48B—array element electrode
50—two-dimensional array of elements
51—array element
52—liquid droplet
54—top substrate assembly
56—spacer
58—reference electrode
60—non-polar fluid
62—insulator layer
64—first hydrophobic coating
66—contact angle
68—second hydrophobic coating
70A—electrical load with droplet present
70B—electrical load with no droplet present
72—array element circuit
74—integrated row driver
76—column driver
78—integrated sensor row addressing
80—column detection circuits
82—serial interface
84—voltage supply interface
86—connecting wires
100—AM-EWOD device
102—first array element electrode
104—second array element electrode
106—reference electrode
108—ion barrier insulator
110—first hydrophobic coating
112—liquid droplet
114—second hydrophobic coating
122—column actuation control circuit
123—addressing circuit
124—column detection circuit
125—addressing circuit
126—first current measurement circuit
127—measuring circuit
128—second current measurement circuit
129—measuring circuit
130—array elements
132—comparator circuit 134—comparator circuit
136—multiplexer (MUX)
140—array elements
150—array elements
200—element array
202—first grouping of array elements
204—second grouping of array elements
206—droplet
208—readout circuitry

What is claimed is:

1. An active matrix electro-wetting on dielectric (AM-EWOD) device comprising:
    a plurality of array elements arranged in an array of rows and columns;
    each column including a column addressing line that applies control signals to a corresponding column of array elements, and each row including a row addressing line that applies control signals to a corresponding row of array elements,
    each array element including an element electrode for receiving an actuation voltage and a switch transistor, wherein the switch transistor is electrically connected between the column addressing line and the element electrode and is switched by the row addressing line; and
    a column detection circuit that is separate from the plurality of array elements, the column detection circuit comprising an addressing circuit that is operable to electrically connect a voltage input to a column addressing line of an array element being sensed from among the plurality of array elements, wherein the voltage input applies an electrical perturbation during a sensing operation to the column addressing line of the array element being sensed, and
    the column detection circuit further comprises a measuring circuit that is operable to electrically connect to one of the column addressing line to measures an output signal from said one of the column addressing lines in response to the electrical perturbation, wherein the output signal varies based upon a capacitance present at the element electrode.

2. The AM-EWOD device of claim 1, wherein the measuring circuit is configured to measure the output signal from a column addressing line that corresponds to a different column addressing line from the array element being sensed.

3. The AM-EWOD device of claim 1, wherein the measuring circuit is configured to measure the output signal from a column addressing that corresponds to the same column addressing as the array element being sensed.

4. The AM-EWOD device of claim 1, wherein the addressing circuit comprises an input switch that closes to connect a voltage input to the column addressing line of the array element being sensed, wherein the voltage input is perturbed for the array element being sensed.

5. The AM-EWOD device of claim 1, wherein the measuring circuit comprises a current measuring circuit and an output switch that closes to connect the current measuring circuit to the column addressing line of the output signal, and the output signal is an output current measured by the current measuring circuit.

6. The AM-EWOD device of claim 1, wherein the measuring circuit includes a comparator circuit that compares the output signal to a reference voltage input and an output switch that closes to connect the comparator circuit to the column addressing line of the output signal, and an output voltage is outputted by the comparator circuit based on the comparison.

7. The AM-EWOD device of claim 6, wherein the column detection circuit further includes a multiplexer that combines outputs of comparator circuits of multiple columns.

8. The AM-EWOD device of claim 1, wherein an array element being sensed is selected by a control signal applied to the row addressing line of the array element being sensed.

9. The AM-EWOD device of claim 1, wherein the column detection circuit is integrated onto a thin film electronics substrate with the array element electrodes.

10. The AM-EWOD device of claim 1, further comprising a column actuation control circuit configured to apply actuation voltages to the element electrodes for actuating the array elements; and
    a switch for disconnecting the column actuation control circuit from the array element being sensed during the sensing operation of the array element being sensed.

11. The AM-EWOD device of claim 10, wherein the column detection circuit and the column actuation control circuit are integrated onto a thin film electronics substrate with the array element electrodes.

12. The AM-EWOD device of claim 1, wherein each array element includes actuation circuitry configured to apply the actuation voltage to the element electrode for actuating the array element, and the actuation circuit includes the switch transistor and a storage capacitor for storing a programming voltage applied through the switch transistor for actuating the array element.

13. The AM-EWOD device of claim 12, further comprising a second transistor having a gate connected to the storage capacitor, wherein the programming voltage stored on the storage capacitor controls the second transistor and the actuation voltage is applied through the second transistor to the element electrode.

14. The AM-EWOD device of claim 1, further comprising a common reference electrode spaced apart from the element electrodes to form a cell gap, an actuation voltage for actuating one of the plurality of array elements being a potential difference between the element electrode and the reference electrode of said array element, wherein during the sensing operation the voltage perturbation is applied to the reference electrode.

15. A method of operating an active matrix electro-wetting on dielectric (AM-EWOD) device comprising the steps of:
    arranging a plurality of array elements in an array of rows and columns, each column including a column addressing line that applies control signals to a corresponding column of array elements, and each row including a row addressing line that applies control signals to a corresponding row of array elements;
    providing a column detection circuit that is separate from the plurality of array elements, the column detection circuit comprising an addressing circuit and a measuring circuit; and
    performing a sensing operation by the steps of:
    operating the addressing circuit to electrically connect a voltage input to a column addressing line of an array element being sensed from among the plurality of array elements, wherein the voltage input applies a voltage perturbation from the addressing circuit to the column addressing line of the array element being sensed; and
    operating the measuring circuit to electrically connect the measuring circuit to one of the column addressing lines to measure an output signal with the measuring circuit from said one of the column addressing lines in response to the electrical perturbation, wherein the output signal varies based upon a capacitance present at an array element electrode of the array element being sensed.

16. The method of operating of claim 15, wherein the measuring circuit measures the output signal from a column addressing line that corresponds to a different column addressing line from the array element being sensed.

17. The method of operating of claim 15, wherein the measuring circuit measures the output signal from a column addressing that corresponds to the same column addressing as the array element being sensed.

18. The method of operating of claim 15, further comprising selecting the array element being sensed by applying a control signal to the row addressing line of the array element being sensed.

19. The method of operating of claim 15, further comprising integrating the column detection circuit onto a thin film electronics substrate with the array element electrodes of the array elements.

20. The method of operating of claim 15, wherein applying the voltage perturbation comprises perturbing a voltage to a first group of array elements element being sensed, and measuring the output signal comprises measuring the output signal from a second group of array elements that is different from the first group of array elements.

* * * * *